US012598774B2

(12) United States Patent
Park et al.

(10) Patent No.: US 12,598,774 B2
(45) Date of Patent: Apr. 7, 2026

(54) SEMICONDUCTOR DEVICES

(71) Applicant: Samsung Electronics Co., Ltd.,
Suwon-si (KR)

(72) Inventors: Jongchul Park, Seoul (KR);
Hyonwook Ra, Hwaseong-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 679 days.

(21) Appl. No.: 17/935,714

(22) Filed: Sep. 27, 2022

(65) Prior Publication Data

US 2023/0116172 A1     Apr. 13, 2023

(30) Foreign Application Priority Data

Oct. 12, 2021    (KR) ........................ 10-2021-0134697

(51) Int. Cl.
| | |
|---|---|
| *H10D 84/83* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ....... *H10D 30/6729* (2025.01); *H10D 30/014*
(2025.01); *H10D 30/43* (2025.01); *H10D*
*30/6735* (2025.01); *H10D 62/121* (2025.01);
*H10D 62/151* (2025.01); *H10D 64/017*
(2025.01); *H10D 84/0186* (2025.01); *H10D*
*84/0188* (2025.01); *H10D 84/038* (2025.01);
*H10D 84/85* (2025.01)

(58) Field of Classification Search
None
See application file for complete search history.

(56) References Cited

U.S. PATENT DOCUMENTS

| | | | |
|---|---|---|---|
| 10,867,998 B1 | 12/2020 | Hung et al. | |
| 2019/0074211 A1 | 3/2019 | Min et al. | |
| 2020/0006075 A1 | 1/2020 | Wang et al. | |
| 2020/0111867 A1 | 4/2020 | Wu et al. | |
| 2021/0028067 A1 | 1/2021 | Jaeger et al. | |
| 2021/0193530 A1 | 6/2021 | Chen et al. | |

*Primary Examiner* — Steven B Gauthier
*Assistant Examiner* — Lamont B Koo
(74) *Attorney, Agent, or Firm* — Wolf, Greenfield &
Sacks, P.C.

(57) ABSTRACT

A semiconductor device includes active regions including
first and second active regions parallel to each other and
extending in a first direction, gate structures including first
gate structures intersecting the first active region, extending
in a second direction, and parallel to each other, and second
gate structures intersecting the second active region, and
opposite the first gate structures in the second direction, a
gate isolation pattern between the first and second gate
structures, a source/drain region on at least one side of the
gate structures, and a common contact plug electrically
connected to the source/drain region, wherein the gate
isolation pattern includes a lower region and upper regions
extending from the lower region in a third direction and
spaced apart from each other in the first direction, wherein
the upper regions are between the first and second gate
structures.

19 Claims, 29 Drawing Sheets

100a

100

~190I

~180'

~107

~101

II                 II'

180'

~190I 140
118

~107
~105

~101

III                III'

IV                                                                                          IV'

190u

190l

150

107
105

101

180

SEMICONDUCTOR DEVICES

CROSS TO REFERENCE TO RELATED APPLICATION(S)

This application claims benefit of priority to Korean Patent Application No. 10-2021-0134697 filed on Oct. 12, 2021 in the Korean Intellectual Property Office, the disclosure of which is incorporated herein by reference in its entirety.

BACKGROUND

The present disclosure relates to semiconductor devices. As demand for high performance, high speed, and/or multifunctionality in a semiconductor device have increased, integration density of a semiconductor device has increased. In manufacturing a semiconductor device having a fine pattern, corresponding to the trend for high integration density of a semiconductor device, patterns have been implemented having a fine width or a fine spacing. Also, to overcome the limitations of operation properties due to the reduction of a size of a planar metal oxide semiconductor FET (MOSFET), there have been attempts to develop a semiconductor device including a FinFET having a three-dimensional channel structure.

SUMMARY

Some example embodiments of the present disclosure provide a semiconductor device having improved production yield.

According to an example embodiment of the present disclosure, a semiconductor device includes active regions including a first active region and a second active region parallel to each other on a substrate and extending in a first direction, a plurality of gate structures including first gate structures intersecting the first active region, extending in a second direction perpendicular to the first direction, and parallel to each other, and second gate structures intersecting the second active region, extending in the second direction, and opposite the first gate structures in the second direction, on the substrate, a gate isolation pattern between the first gate structures and the second gate structures, a source/drain region on at least one side of the plurality of gate structures and including a first source/drain region on the first active region and a second source/drain region on the second active region, and a common contact plug electrically connected to the first and second source/drain regions, wherein the gate isolation pattern includes a lower region and upper regions extending from the lower region in a third direction and spaced apart from each other in the first direction, wherein the upper regions are between the first gate structures and the second gate structures, wherein a portion of the common contact plug is between the upper regions in the first direction, wherein the first and second directions are parallel to an upper surface of the substrate, and wherein the third direction is perpendicular to the upper surface of the substrate.

According to an example embodiment of the present disclosure, a semiconductor device includes a first active region and a second active region parallel to each other on a substrate and extending in a first direction, a device isolation layer between the first active region and the second active region, a plurality of gate structures including first gate structures intersecting the first active region, extending in a second direction perpendicular to the first direction, and parallel to each other, and second gate structures intersecting the second active region, extending in the second direction, and opposite the first gate structures in the second direction, on the substrate, a gate isolation pattern on the device isolation layer and including a lower region and upper regions spaced apart from each other in the first direction on the lower region, and a first source/drain region on the first active region and a second source/drain region on the second active region, wherein each of the upper regions of the gate isolation pattern includes a first side surface in contact with the first gate structures, a second side surface opposite the first side surface and in contact with the second gate structures, a third side surface, and a fourth side surface opposite the third side surface, and wherein a width of the lower region of the gate isolation pattern in the second direction is substantially equal to a width of each of the upper regions, and the lower region includes first portions overlapped by the upper regions and a second portion extending from the overlapped first portions in the first direction.

According to an example embodiment of the present disclosure, a semiconductor device includes active regions including a first active region and a second active region parallel to each other on a substrate and extending in a first direction, a plurality of channel layers including a plurality of first channel layers spaced apart from each other in a third direction perpendicular to an upper surface of the substrate on the first active region and a plurality of second channel layers spaced apart from each other in the third direction on the second active region, a device isolation layer between the first active region and the second active region, a plurality of gate structures including first gate structures intersecting the first active region, extending in a second direction perpendicular to the first direction, and parallel to each other, and second gate structures intersecting the second active region, extending parallel to each other in the second direction, and opposite the first gate structures in the second direction, on the substrate, a gate isolation pattern electrically isolating the first and second gate structures from each other on the device isolation layer, source/drain regions including a first source/drain region on the first active region and a second source/drain region on the second active region, and a common contact plug electrically connected to the first and second source/drain regions, wherein a side surface of the common contact plug extends along the first and second gate structures and the gate isolation pattern, wherein a lower surface of the common contact plug comprises a first portion in contact with the source/drain regions and a second portion in contact with the gate isolation pattern and at a level higher than a level of the first portion, and wherein a lower surface of the gate isolation pattern is at a level lower than a level of a lower surface of a lowermost channel layer among the plurality of channel layers.

According to an example embodiment of the present disclosure, a method of manufacturing a semiconductor device includes forming preliminary gate structures crossing active regions extending in a first direction and extending in a second direction on a substrate, forming a lower interlayer insulating layer covering the active regions and the preliminary gate structures, forming first preliminary gate structures and second preliminary gate structures isolated from each other in the second direction by forming a trench configured to have a linear shape, to intersect the gate structures, and to extend in the first direction, forming a preliminary gate isolation pattern by filling the trench with an insulating material, removing a portion of an upper end of the preliminary gate isolation pattern and forming a gate isolation pattern including upper regions including a remaining upper end and a lower region below the upper regions, forming an upper interlayer insulating layer covering the gate isolation pattern and the preliminary gate structures, and forming a common contact plug intersecting the lower region of the gate isolation pattern and extending in the second direction.

According to an example embodiment of the present disclosure, a method of manufacturing a semiconductor device includes forming preliminary gate structures intersecting active regions extending in a first direction and extending in a second direction on a substrate, forming a first interlayer insulating layer covering the active regions and the preliminary gate structures, forming first and second gate structures isolated from each other in the second direction by forming a trench configured to have a linear shape, to intersect the gate structures, and to extend in the first direction, forming a preliminary gate isolation pattern by filling the trench with an insulating material, selectively etching the first interlayer insulating layer between the first gate structures and between the second gate structures to be partially recessed, forming a gate isolation pattern by removing a portion of the preliminary gate isolation pattern exposed through the recess, forming a second interlayer insulating layer covering the first gate structures, the second gate structures, and the gate isolation pattern on the recessed first interlayer insulating layer, and forming a common contact plug.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
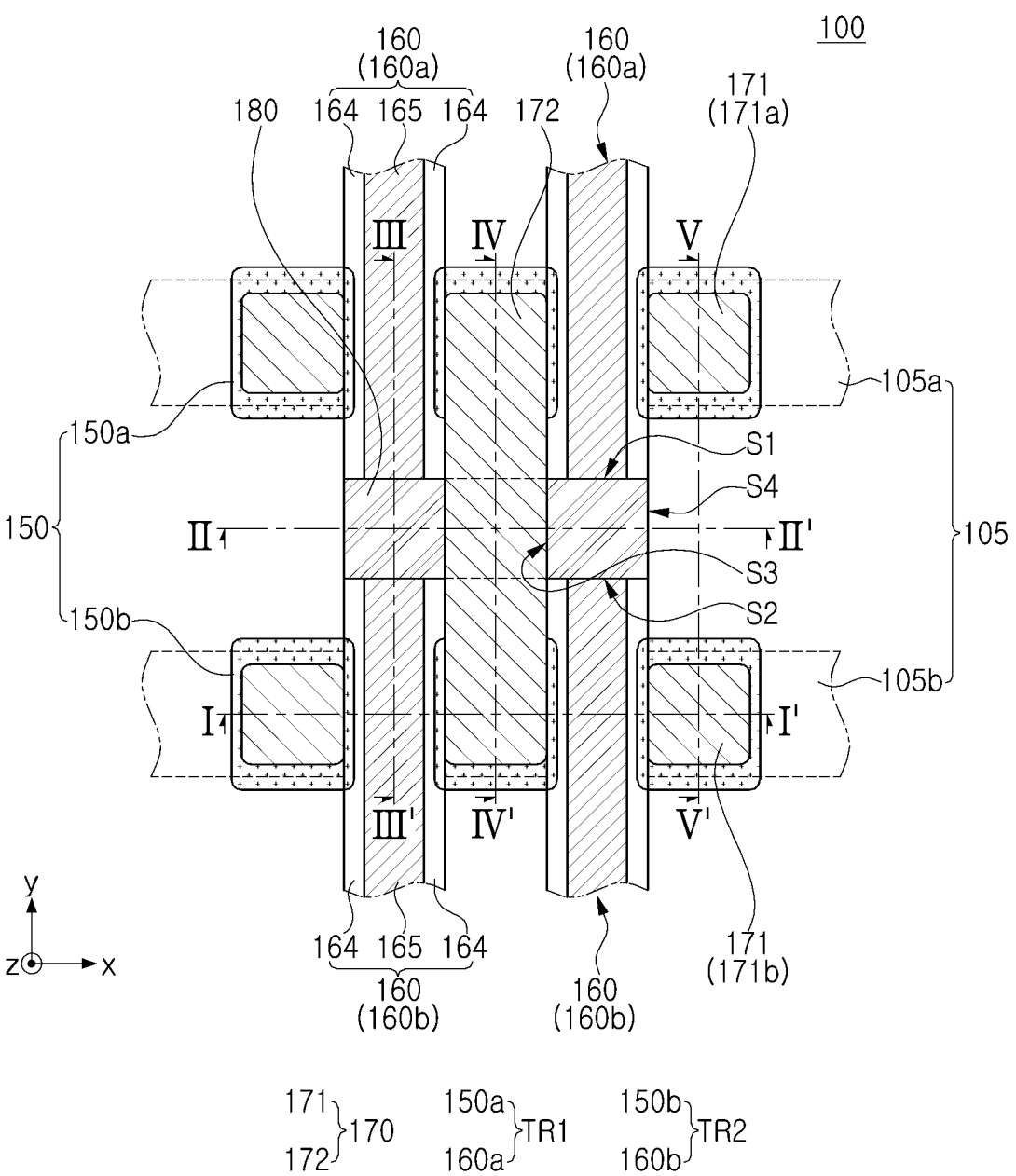
FIG. 1 is a plan diagram illustrating a semiconductor device according to an example embodiment of the present disclosure.
Figure 2A:
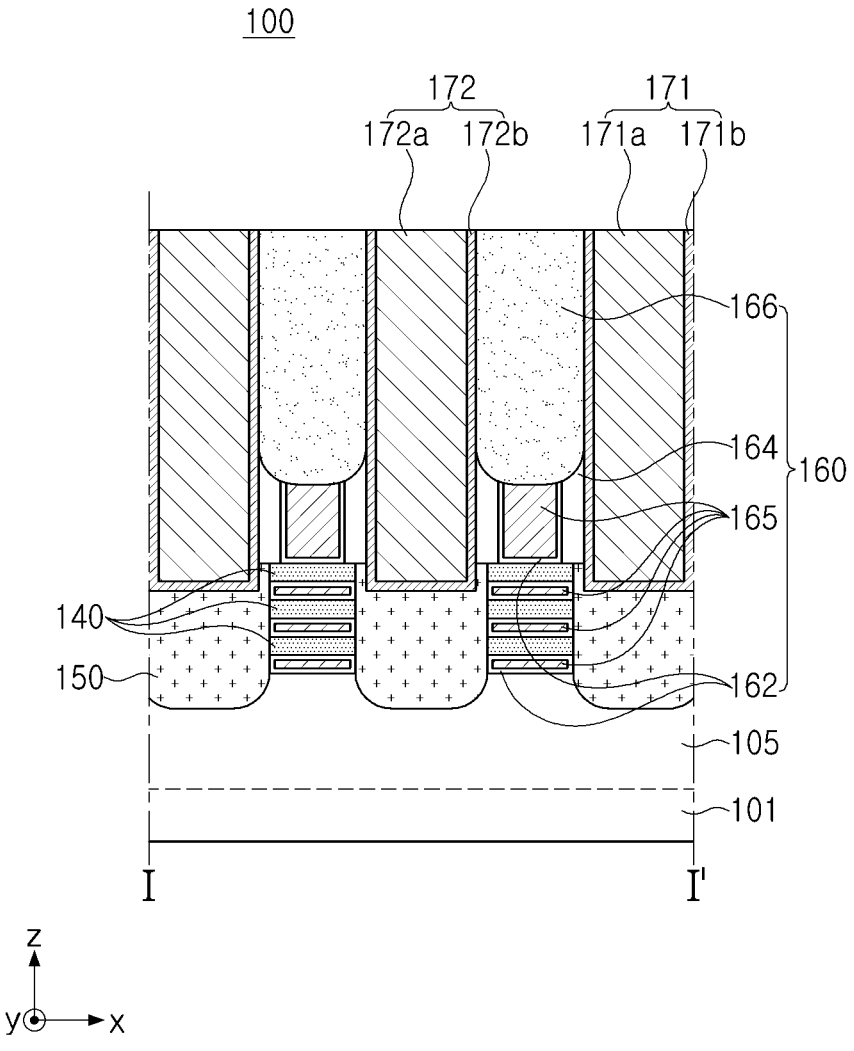
FIGS. 2A to 2E are cross-sectional diagrams illustrating a semiconductor device according to an example embodiment of the present disclosure.
Figure 2B:
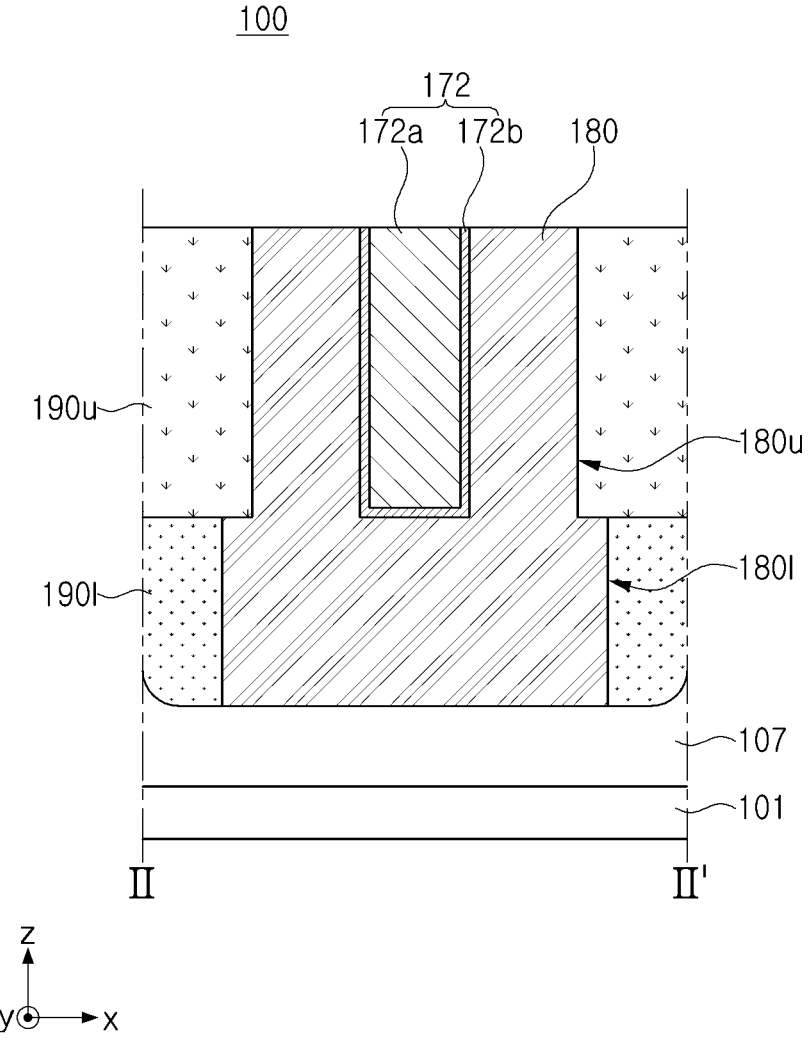
Figure 2C:
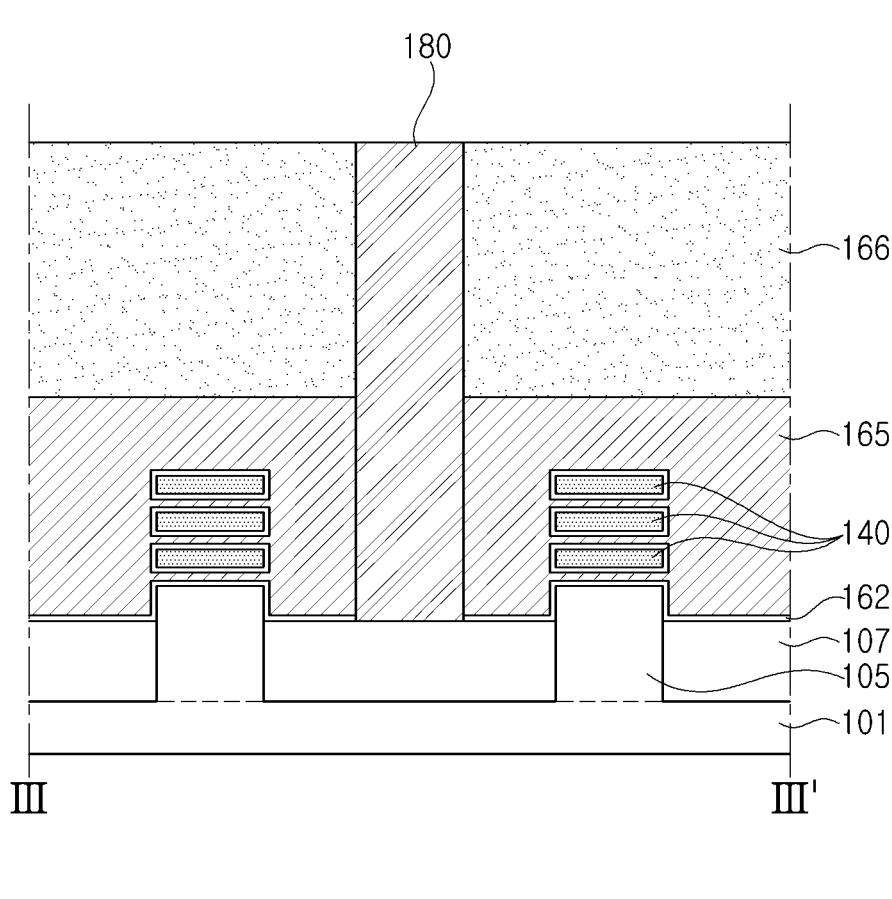
Figure 2D:
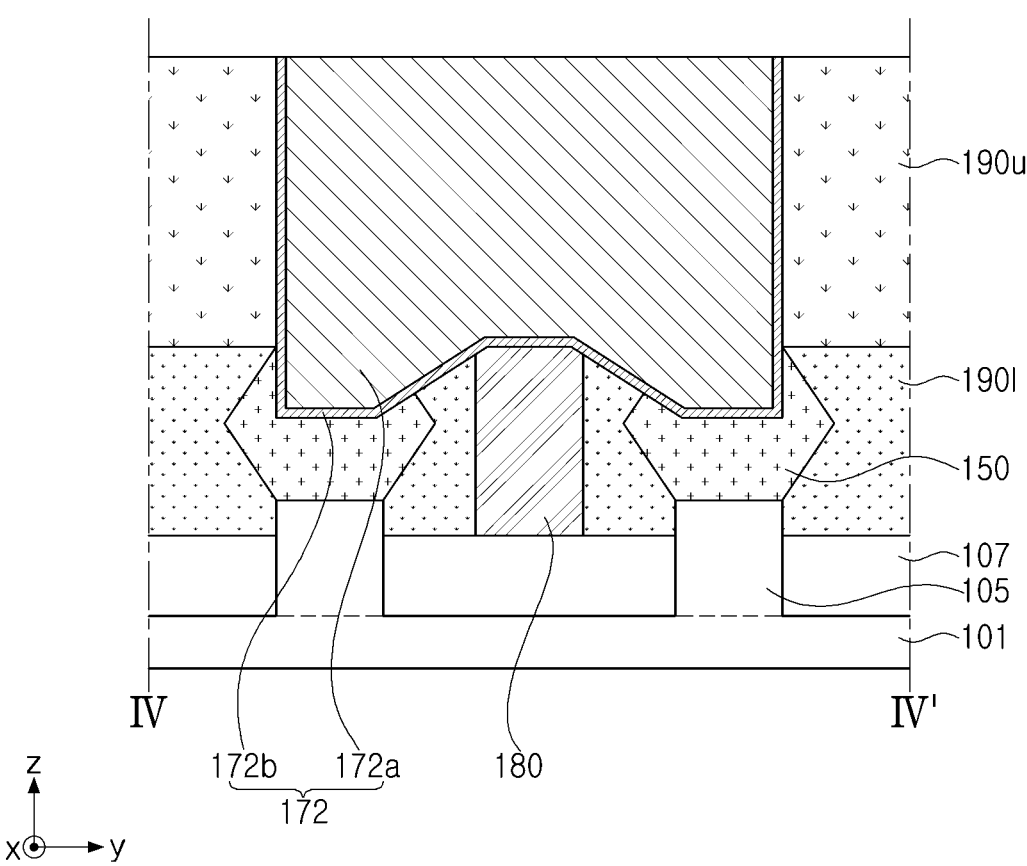
Figure 2E:
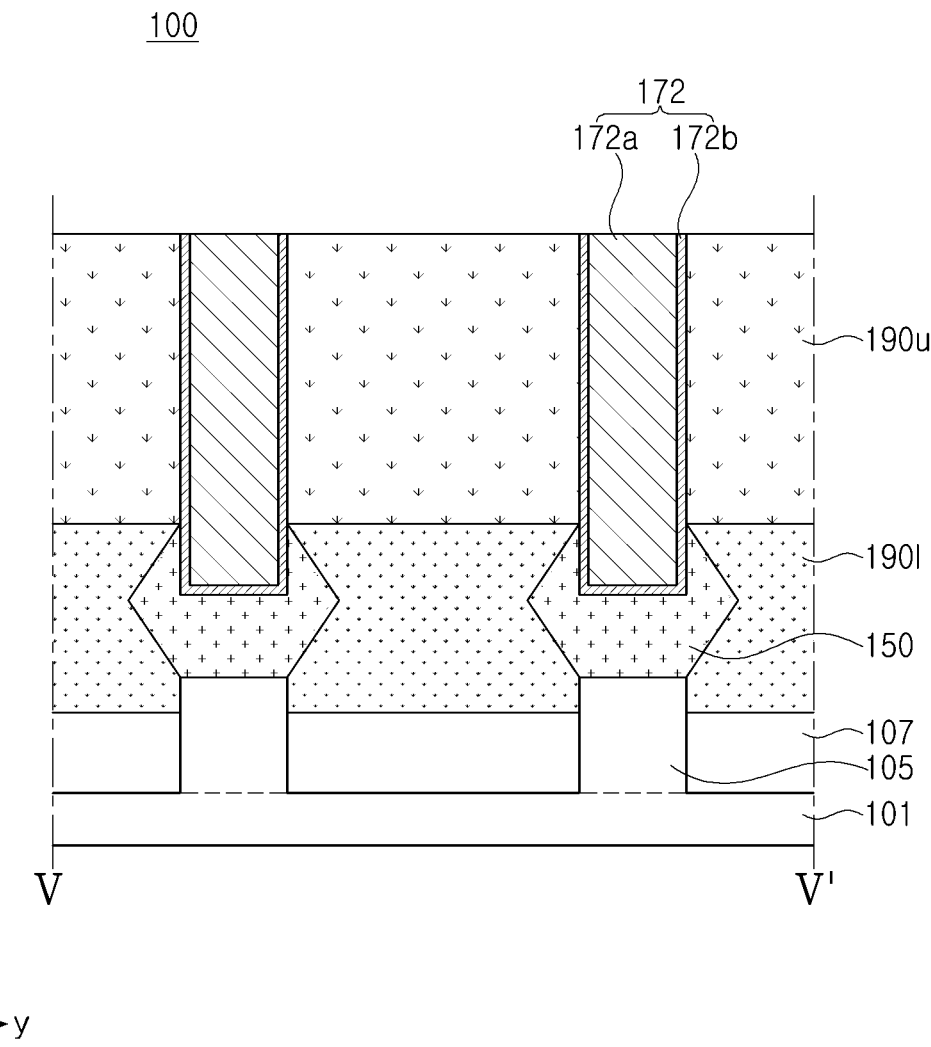

FIG. 1 is a plan diagram illustrating a semiconductor device 100 according to an example embodiment. FIGS. 2A to 2E are cross-sectional diagrams illustrating a semiconductor device 100 according to an example embodiment. FIG. 2A is a cross-sectional diagram illustrating a semiconductor device 100 taken along line I-I', FIG. 2B is a cross-sectional diagram illustrating a semiconductor device 100 taken along line FIG. 2C is a cross-sectional diagram illustrating a semiconductor device 100 taken along line FIG. 2D is a cross-sectional diagram illustrating a semiconductor device 100 taken along line IV-IV', and FIG. 2E is a cross-sectional diagram illustrating a semiconductor device 100 taken along line V-V'. For ease of description, only main components of the semiconductor device are illustrated in FIGS. 1 to 2E.

Referring to FIGS. 1 to 2E, a semiconductor device 100 may include a substrate 101, active regions 105 on the substrate 101, device isolation layers 107 isolating the active regions 105 from each other, channel layers 140 disposed on the active regions 105, source/drain regions 150 in contact with the channel layers 140, gate structures 160 extending by intersecting the active regions 105, contact plugs 170, a gate isolation pattern 180, and an interlayer insulating layer 190. The gate structures 160 may include a gate dielectric layer 162, a gate electrode 165, a gate spacer 164, and a gate capping layer 166.

In an example embodiment, the channel layers 140 may be vertically spaced apart from each other on the active regions 105. Accordingly, the active regions 105 may have a fin structure, and the gate electrode 165 may be disposed between the active regions 105 and the lowermost channel layer 140, between the channel layers 140, and on an uppermost channel layer 140. Accordingly, the semiconductor device 100 may be a transistor having a multi-bridge channel FET (MBCFET™) structure, a gate-all-around type field effect transistor, formed by the channel layers 140, the source/drain regions 150, and the gate structures 160.

However, according to an example embodiment, differently from the aforementioned example embodiment, the channel structure may have a plurality of fin structures disposed on the active regions 105, rather than the channel layers vertically spaced apart from each other. Accordingly, the semiconductor device 100 may be a fin-type field effect transistor formed by the channel structure, the source/drain regions 150, and the gate structures 160.

The substrate 101 may have an upper surface extending in the X-direction and the Y-direction. The substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor on insulator (SeOI) layer, or the like.

The active regions 105 may extend in a direction parallel to the upper surface of the substrate 101, that is, for example, in the X-direction. The active regions 105 may be spaced apart from each other in the Y-direction and disposed in parallel to each other. The active regions 105 may protrude from the upper surface of the substrate 101 in a vertical direction, the Z-direction. Upper ends of the active regions 105 may protrude to a predetermined level from upper ends of the device isolation layers 107. The active regions 105 may be formed as a portion of the substrate 101, or may include an epitaxial layer grown from the substrate 101. However, portions of the active regions 105 on the substrate 101 may be recessed on opposite sides of the gate structures 160, and the source/drain regions 150 may be disposed on the recessed active regions 105.

In an example embodiment, the active regions 105 may include a first active region 105a and a second active region 105b adjacent to each other. Each of the first active region 105a and the second active region 105b may have a linear shape or a bar shape extending in the X-direction. The first active region 105a and the second active region 105b may be spaced apart from each other and may extend in parallel, but an example embodiment thereof is not limited thereto. The first active region 105a and the second active region 105b may have different types of conductivity. When the first active region 105a has first-type conductivity, the second active region 105b may have second-type conductivity different from the first-type conductivity. The first-type conductivity may be N-type conductivity, and the second-type conductivity may be P-type conductivity.

The device isolation layers 107 may define active regions 105 on the substrate 101. The device isolation layers 107 may be disposed between the active regions 105. The device isolation layers 107 may have upper ends having a level lower than a level of upper ends of the active regions 105. Accordingly, the device isolation layers 107 may partially expose the upper portions of the active regions 105. The upper portions of the active regions 105 may protrude upward in the Z-direction beyond the upper ends (e.g., upper surfaces) of the device isolation layers 107. In an example embodiment, the device isolation layers 107 may have a curved upper surface having a level increasing toward the active regions 105, but an example embodiment thereof is not limited thereto. The device isolation layers 107 may be formed by, for example, a shallow trench isolation (STI) process. The device isolation layers 107 may be formed of an insulating material. The device isolation layers 107 may be, for example, an oxide, a nitride, or a combination thereof.

The channel layers 140 may be spaced apart from each other in the Z-direction perpendicular to the substrate 101 on the active regions 105. The channel layers 140 may be electrically connected to the source/drain regions 150 and may be spaced apart from the upper surfaces of the active regions 105. The channel layers 140 may have a width the same as or similar to those of the active regions 105 in the Y-direction, and may have a width the same as or similar to as those of the gate structures 160 in the X-direction. However, in example embodiments, the channel layers 140 may have a reduced width such that side surfaces thereof may be disposed below the gate structures 160 in the Z-direction. The channel layers 140 may include three channel layers, but the number of channel layers is not limited thereto and may be varied. For example, in example embodiments, the channel layers 140 may further include a channel layer disposed on the upper surface of the active regions 105. The channel layers 140 may be formed of a semiconductor material, and may include, for example, at least one of silicon (Si), silicon germanium (SiGe), and germanium (Ge). The channel layers 140 may include the same material, but may include different materials in other example embodiments.

The source/drain regions 150 may be disposed on the active regions 105 on at least one side of the channel layers 140. The source/drain regions 150 may cover upper surfaces of the active regions 105 and may be on a side surface of each of the channel layers 140. For example, a lower end of the source/drain regions 150 may cover the upper surfaces of the active regions 105. The source/drain regions 150 may be in contact with the channel layers 140 (e.g., with the side surfaces thereof). Portions of the source/drain regions 150 may be recessed into upper portions of the active regions 105, but in example embodiments, the presence or absence of the recess and a depth of the recess may be varied. The source/drain regions 150 may be a semiconductor layer including silicon (Si), and may be configured as an epitaxial layer.

In an example embodiment, the source/drain regions 150 may include a first source/drain region 150a disposed on the first active region 105a, and a second source/drain region 150b disposed on the second active region 105b. The first and second source/drain regions 150a and 150b may include different types of impurities and/or different concentrations. For example, the first source/drain region 150a may have second-type conductivity, and the second source/drain region 150b may have first-type conductivity. Moreover, the first active region 105a and the second active region 105b may have different conductivity types, such as first-type conductivity and second-type conductivity, respectively. Accordingly, the first source/drain region 150a and the first active region 105a may have different types of conductivity.

In example embodiments, the first source/drain region 150a may have a merged form in which the first source/drain regions 150a may be physically connected to each other between the active regions 105 adjacent to each other in the Y-direction, but an example embodiment thereof is not limited thereto.

The gate structures 160 may intersect the active regions 105 and the channel layers 140 on the active regions 105 and the channel layers 140 and may extend in one direction, that is, for example, the Y-direction. Channel regions of transistors may be formed in the active regions 105 and/or the channel layers 140 intersecting the gate structures 160.

Each of the gate structures 160 may include a gate dielectric layer 162, a gate electrode 165, a gate spacer 164, and a gate capping layer 166. The upper and lower surfaces of each of the gate structures 160 that are between the plurality of channel layers 140 may be in contact with the channel layers 140.

The gate dielectric layer 162 may be disposed between each of the active regions 105 and the gate electrode 165 and between the channel layers 140 and the gate electrode 165, and may cover at least a portion of surfaces of the gate electrode 165. For example, the gate dielectric layer 162 may surround all surfaces other than an uppermost surface of the gate electrode 165. The gate dielectric layer 162 may extend to a region between the gate electrode 165 and the gate spacer 164, but an example embodiment thereof is not limited thereto. The gate dielectric layer 162 may include an oxide, nitride, or high-k material. The term "high-k material" may refer to a dielectric material having a dielectric constant higher than that of a silicon oxide film ($SiO_2$). The high dielectric constant material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In example embodiments, the gate dielectric layer 162 may include multiple layers.

The gate electrode 165 may fill a region between the channel layers 140 and may extend to a region above the channel layers 140 on the active regions 105. The gate electrode 165 may be spaced apart from the channel layers 140 by the gate dielectric layer 162. The gate electrode 165 may include a conductive material, such as, for example, a metal nitride such as a titanium nitride film (TiN), a tantalum nitride film (TaN), or a tungsten nitride film (WN), and/or a metal material such as aluminum (Al), tungsten (W), or molybdenum (Mo), or a semiconductor material such as doped polysilicon. In example embodiments, the gate electrode 165 may include two or more layers. Depending on the configuration of the semiconductor device 100, the gate electrode 165 may be isolated by a separator between at least a portion of the transistors adjacent to each other. The gate electrode 165 may include different materials depending on transistor regions.

The gate spacers 164 may be disposed on opposite sidewalls of the gate electrode 165 and may extend in the Z-direction perpendicular to the upper surface of the substrate 101. The gate spacer 164 may include a portion of which a width of an upper portion is smaller than a width of a lower portion. However, in example embodiments, the shape of the gate spacer 164 may be varied. The gate spacer 164 may insulate the source/drain regions 150 from the gate electrode 165. The gate spacer 164 may include multiple layers in example embodiments. The gate spacer 164 may be formed of oxide, nitride, or oxynitride.

The gate capping layer 166 may be disposed on the gate electrode 165. The gate capping layer 166 may be a structure for protecting the gate electrode 165 from etching in a subsequent process after the gate electrode 165 is formed, but an example embodiment of the gate capping layer 166 is not limited thereto. The gate capping layer 166 may be disposed on the gate electrode 165 and the gate spacer 164, and at least a portion of a lower surface thereof may be surrounded by the gate electrode 165 and the gate spacer 164. In an example embodiment, the gate capping layer 166 may include a lower surface curved outwardly toward the substrate 101. The gate capping layer 166 may include, for example, a silicon nitride insulating material.

In an example embodiment, the gate structures 160 may include first gate structures 160a and second gate structures 160b that are opposite each other in the Y-direction, the direction in which the gate structures 160 extend, and physically/electrically isolated from each other. The first gate structures 160a may intersect the first active region 105a and may be parallel to each other, and the second gate structures 160b may intersect the second active region 105b and may be parallel to each other. The first gate structures 160a and the second gate structures 160b may have substantially the same width in the X-direction. The first gate structures 160a and the second gate structures 160b may be physically isolated from each other and may be electrically isolated from each other.

In example embodiments, the semiconductor device 100 may further include internal spacer layers disposed side by side with the gate electrode 165 between the channel layers 140. The gate electrode 165 disposed below an uppermost channel layer among the channel layers 140 may be spaced apart from and electrically isolated from the source/drain regions 150 by the internal spacer layers. A side surface of the internal spacer layers opposite the gate electrode 165 may be inwardly curved toward the gate electrode 165, but an example embodiment thereof is not limited thereto. The internal spacer layers may be formed of oxide, nitride, or oxynitride, or may be formed of, for example, a low-K film. In example embodiments, the internal spacer layers may not be provided.

The gate isolation pattern 180 may be disposed on the device isolation layers 107 between the first active region 105a and the second active region 105b. In an example embodiment, the gate isolation pattern 180 may have a linear shape extending in the X-direction, but an example embodiment thereof is not limited thereto and the gate isolation pattern 180 may have a plurality of structures isolated from each other and spaced apart from each other (see FIGS. 5A and 5B). The gate isolation pattern 180 may include at least one of silicon nitride, silicon oxide, silicon oxynitride, or a nitride material. The gate isolation pattern 180 may include the same material as that of the gate spacer 164, but an example embodiment thereof is not limited thereto.

The gate isolation pattern 180 may include a lower region 180l and upper regions 180u. The lower region 180l may have a linear shape extending in the X-direction. The line-shaped corner portion may have various shapes, such as an angular shape or a circular shape. A lower surface of the lower region 180l may be disposed at/on a level lower than a level of a lower surface of a lowermost channel layer among the channel layers 140 or a level of lower surfaces of the source/drain regions 150. The lower surface of the lower region 180l may be disposed at/on a level substantially the same level as or lower than a level of the lower surface of the gate structures 160. The lower region 180l may extend into the device isolation layers 107, but an example embodiment thereof is not limited thereto, and the lower region 180l may be in contact with the device isolation layers 107 or may be spaced apart from the device isolation layers 107. The lower end corner of the lower region 180l may have an angled shape, but an example embodiment thereof is not limited thereto, and the lower end corner may include various shapes formed by an etching process, such as a curved shape, curved toward the substrate 101. The upper regions 180u may be disposed on the lower region 180l. The upper regions 180u may extend from the lower region 180l in the Z-direction and may be spaced apart from each other in the X-direction. The upper regions 180u may be in contact with at least one side of the gate structures 160 and may be integrally connected to the lower region 180l. The upper regions 180u may be disposed between the first gate structures 160a and the second gate structures 160b. Each of the upper regions 180u may have a quadrangular columnar structure including a first side surface S1 in contact with the first gate structures 160a, a second side surface S2 opposite the first side surface S1 and in contact with the second gate structures 160b, a third side surface S3 in contact with the common contact plug 172, and a fourth side surface S4 opposite the third side surface S3. For example, the first side surface S1 and the second side surface S2 may be spaced apart from each other in the Y-direction and parallel to each other, and the third side surface S3 and the fourth side surface S4 may be spaced apart from each other in the X-direction and parallel to each other. A width of the first side surface S1 may be substantially the same as (i.e., substantially equal to) a width of each of the first gate structures 160a in the X-direction, and a width of the second side surface S2 may be substantially the same as a width of each of the second gate structures 160b in the X-direction. The third side surface S3 and the fourth side surface S4 may be coplanar (e.g., aligned/collinear in the Y-direction) with the side surfaces of the first and second gate structures 160a and 160b.

A sum of the planar areas of the upper regions 180u may be smaller than a sum of the planar areas of the lower region 180l. The upper regions 180u may overlap respective portions of the lower region 180l in a vertical direction (i.e., the Z-direction). The upper regions 180u may have a width substantially the same as that of the lower region 180l in the Y-direction, but may have different widths in the X-direction. The lower region 180l may include a region overlapped by the upper regions 180u and may extend in the X-direction. That is, the lower region 180l may have a region (e.g., first portions) overlapped by the upper regions 180*u* and a region (e.g., a second portion) extending from the overlapped region in the X-direction, and may have a constant width in the Y-direction. Accordingly, the gate isolation pattern 180 may further include a step difference (e.g., a step shape) along/extending in the X-direction provided/defined by the lower region 180*l* and the upper regions 180*u*.

The interlayer insulating layer 190 may cover the source/drain regions 150 and the gate structures 160, and may cover the device isolation layers 107 in a region not illustrated. The interlayer insulating layer 190 may include, for example, at least one of an oxide, a nitride, and an oxynitride, and may include a low-K material.

In an example embodiment, the interlayer insulating layer 190 may include a lower interlayer insulating layer 190*l* and an upper interlayer insulating layer 190*u* on the lower interlayer insulating layer 190*l*. An upper surface of the lower interlayer insulating layer 190*l* may be in contact with a lower surface of the upper interlayer insulating layer 190*u*. The upper surface of the lower interlayer insulating layer 190*l* may be disposed at/on substantially the same level as a level of (e.g., may be substantially coplanar with) the upper surface of the lower region 180*l*. The upper surface of the lower interlayer insulating layer 190*l* may be disposed at/on the same level as a level of the upper surface of the source/drain regions 150, but an example embodiment thereof is not limited thereto and may be varied. That is, a thickness of the lower interlayer insulating layer 190*l* may be varied to adjust the level of the upper surface of the lower region 180*l*. The lower interlayer insulating layer 190*l* may include the same material as that of the upper interlayer insulating layer 190*u*, but an example embodiment thereof is not limited thereto. When the upper and lower interlayer insulating layers 190*u* and 190*l* include the same material, in example embodiments, impurities may be included in the upper end (e.g., upper region) of the lower interlayer insulating layer 190*l* such that a boundary with the upper interlayer insulating layer 190*u* may be distinct. However, when impurities are removed through a subsequent process such as a cleaning process, the boundary may not be distinct. The impurities may be formed in a portion of the interlayer insulating layer 190 by using an ion beam, or the like, during an etching process to form the upper region 180*u*.

The contact plugs 170 may penetrate the interlayer insulating layer 190. The contact plugs 170 may include a single contact plug 171 electrically connected to the first source/drain regions 150*a* or the second source/drain regions 150*b*, and a common contact plug 172 electrically connected to the first source/drain regions 150*a* and the second source/drain regions 150*b*.

The single contact plug 171 may penetrate the interlayer insulating layer 190 and may be electrically connected to each of the source/drain regions 150, and may apply an electrical signal to the source/drain regions 150. The single contact plug 171 may be disposed on the source/drain regions 150 as illustrated in FIG. 1. The single contact plug 171 may have an inclined side surface of which a width may decrease in a direction toward the substrate 101 depending on an aspect ratio, but an example embodiment thereof is not limited thereto. The single contact plug 171 may be recessed by a predetermined depth from the source-drain regions 150, but an example embodiment thereof is not limited thereto. In example embodiments, the single contact plug 171 may be in contact with the upper surface of the source/drain regions 150 along the upper surface without being recessed into the source/drain regions 150.

The common contact plug 172 may be in contact with the first and second source/drain regions 150*a* and 150*b* simultaneously. The common contact plug 172 may have a linear shape extending in the Y-direction between the gate structures 161. A portion of the common contact plug 172 may be disposed between the upper regions 180*u* of the gate isolation pattern 180 in the X-direction. The common contact plug 172 may include a first lower surface in contact with the first and second source/drain regions 150*a* and 150*b* and a second lower surface in contact with the gate isolation pattern 180. As used herein, the terms "first lower surface" and "second lower surface" may, in some embodiments, refer to first and second portions, respectively, of the same, continuous lower surface. The portion of the common contact plug 172 may be disposed between the upper regions 180*u* on (and/or as a part of) the second lower surface. The first lower surface may be disposed at/on a level lower than a level of the second lower surface. The second lower surface may be in contact with the upper surface of the lower region 180*l* of the gate isolation pattern 180. In an example embodiment, the common contact plug 172 may be recessed from the source/drain regions 150 by a predetermined depth. In this case, the lower surface of the common contact plug 172 may extend from an internal portion of the source/drain regions 150 to the upper surface of the lower region 180*l* and may cover the upper surface of the lower region 180*l*. The upper surface of the lower region 180*l* may be an exposed/protruding region, as the upper region 180*u* is not disposed thereon. The lower region 180*l* of the gate isolation pattern 180 may function as an etch stop layer in an etching process for forming the common contact plug 172, and accordingly, the second lower surface in contact with the upper end of the lower region 180*l* may be disposed at/on a level higher than a level of the first lower surface. One or more side surfaces of the common contact plug 172 may extend along the first gate structures 160*a*, the gate isolation pattern 180, and the second gate structures 160*b*. Moreover, an upper surface of the common contact plug 172 may, in some embodiments, be coplanar with upper surfaces of the upper regions 180*u*, respectively, as shown in FIG. 2B.

The contact plugs 171 and 172 may include plug layers 171*a* and 172*a* and barrier layers 171*b* and 172*b*. The plug layers 171*a* and 172*a* may include, for example, a metal nitride such as a titanium nitride film (TiN), a tantalum nitride film (TaN), or a tungsten nitride film (WN), and/or a metal material such as aluminum (Al), tungsten (W), or molybdenum (Mo). The barrier layers 171*b* and 172*b* may conformally cover side surfaces and bottom surfaces of the plug layers 171*a* and 172*a*. The barrier layers 171*b* and 172*b* may include, for example, a metal nitride such as a titanium nitride film (TiN), a tantalum nitride film (TaN), or a tungsten nitride film (WN).

In an example embodiment, the semiconductor device 100 may include a first transistor region TR1 in which the first active region 105*a*, the first source/drain regions 150*a*, and the first gate structures 160*a* are disposed and second transistor regions TR2 in which the second active region 105*b*, the second source/drain regions 150*b*, and the second gate structures 160*b* are disposed. One of the first and second transistor regions TR1 and TR2 may be an NMOS transistor region, and the other may be a PMOS transistor region. Each of the first and second transistor regions TR1 and TR2 may include a transistor having the above-described multi-bridge channel FET (MBCFET™) structure. A boundary between the first and second transistor regions TR1 and TR2 may be provided/defined by the gate isolation pattern 180. In an example embodiment, the first and second transistor regions TR1 and TR2 may be electrically connected to each other by a common contact plug 172.

Figure 3:
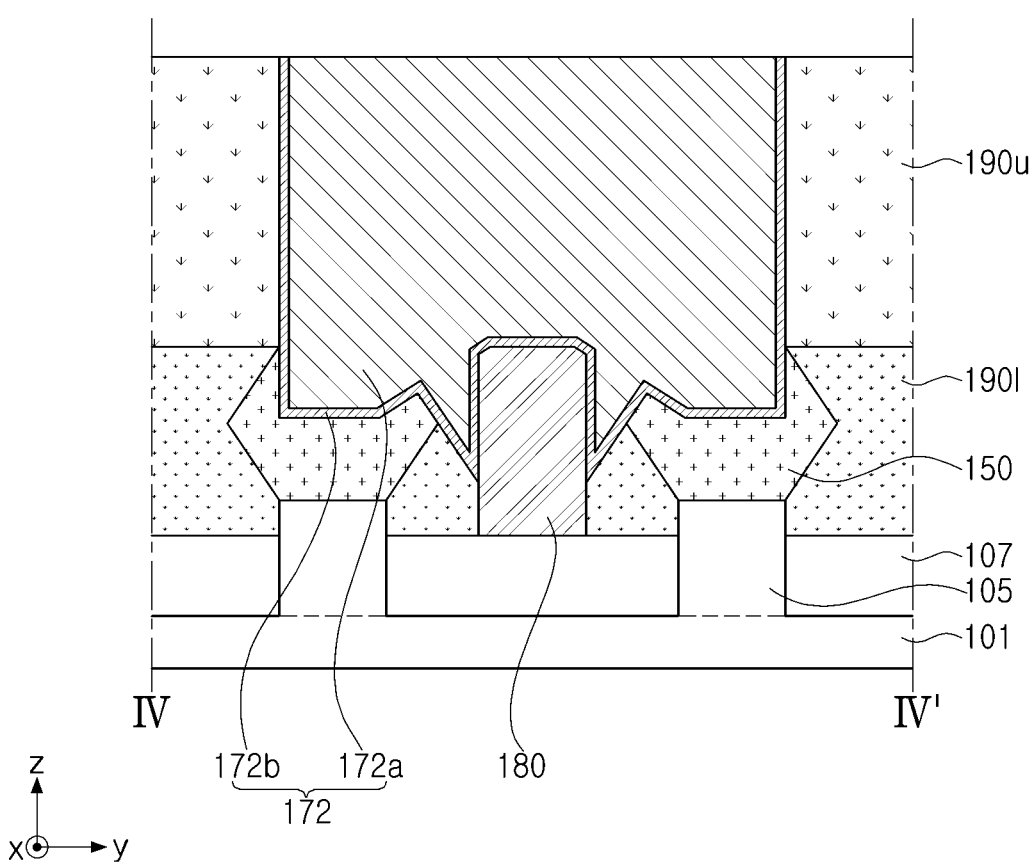
FIG. 3 is a cross-sectional diagram illustrating a semiconductor device according to an example embodiment of the present disclosure.

FIG. 3 is a cross-sectional diagram illustrating a semiconductor device 100a according to an example embodiment, taken along line IV-IV' in FIG. 1.

Referring to FIG. 3, the semiconductor device 100a according to example embodiments may include the common contact plug 172 configured differently from the example in FIG. 2D. The common contact plug 172 may extend/protrude downward to a side surface of the lower region 1801 of the gate isolation pattern 180. Accordingly, the common contact plug 172 may be on and in contact with an upper end of the side surface of the lower region 1801. Moreover, in example embodiments, the common contact plug 172 may extend/protrude downward along a side surface of the lower region 1801 and may be in contact with the device isolation layers 107 or may extend/protrude downward into the device isolation layers 107.

Figure 4A:
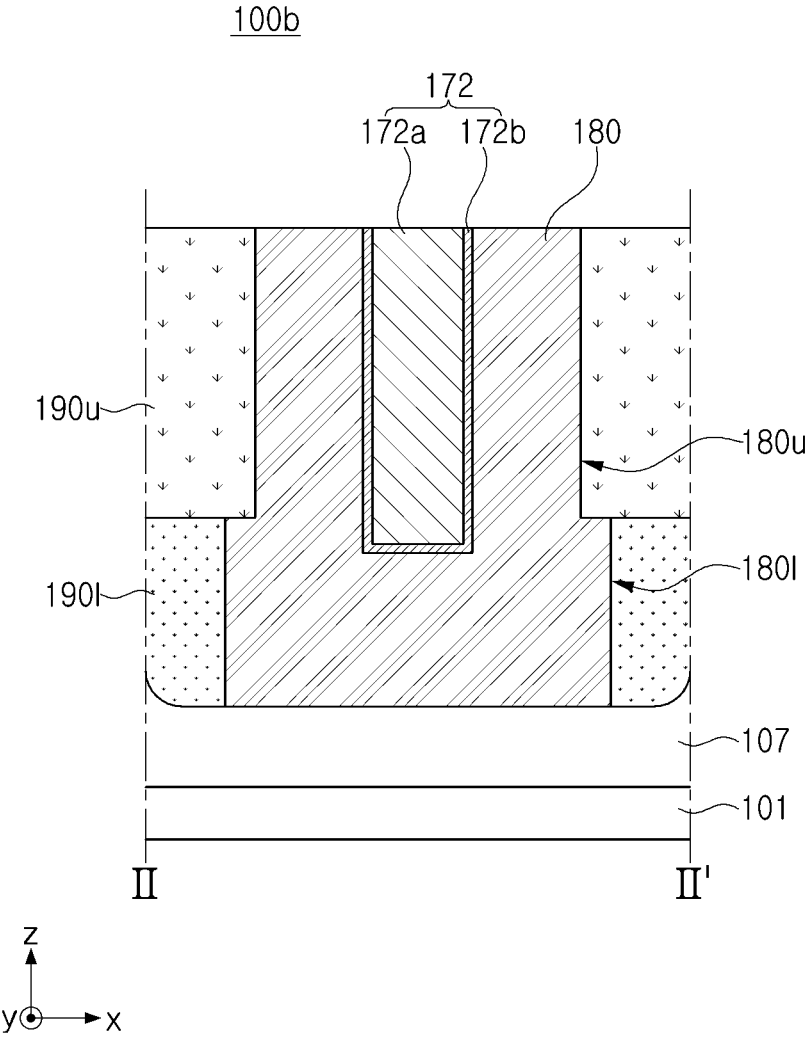
FIGS. 4A and 4B are cross-sectional diagrams illustrating a semiconductor device according to an example embodiment of the present disclosure.
Figure 4B:
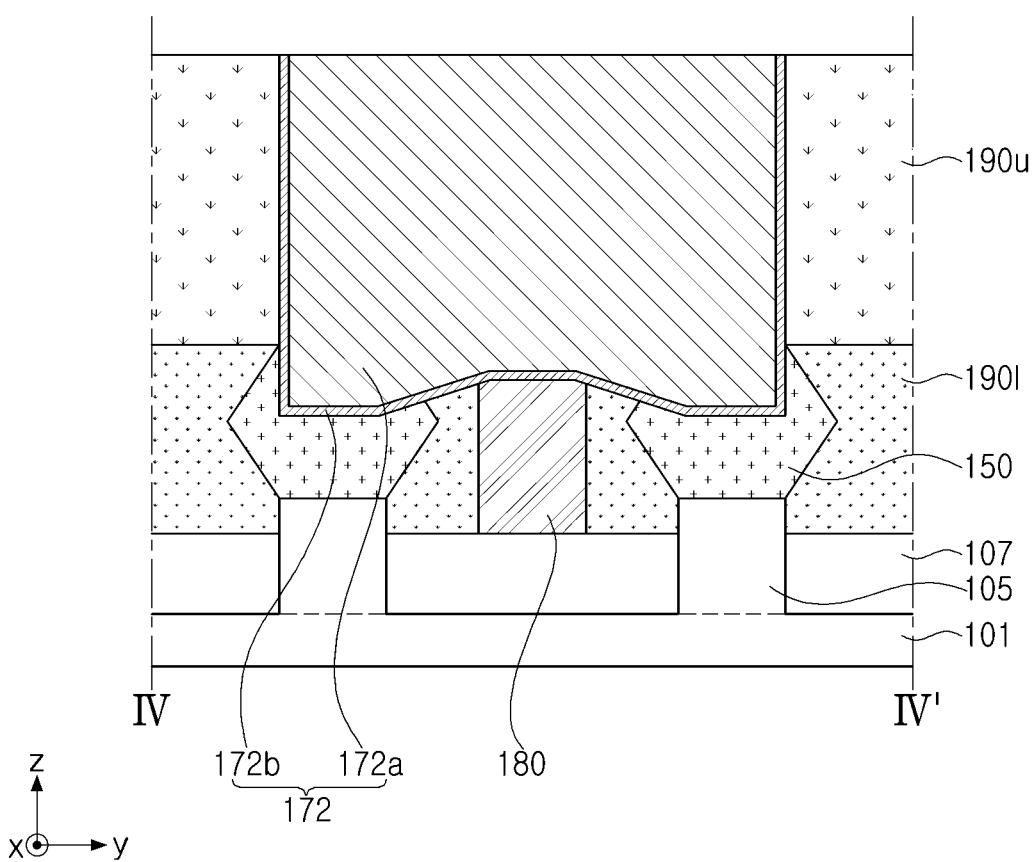

FIGS. 4A and 4B are cross-sectional diagrams illustrating a semiconductor device 100b according to an example embodiment, taken along lines II-IF and IV-IV' in FIG. 1, respectively.

Figure 16:
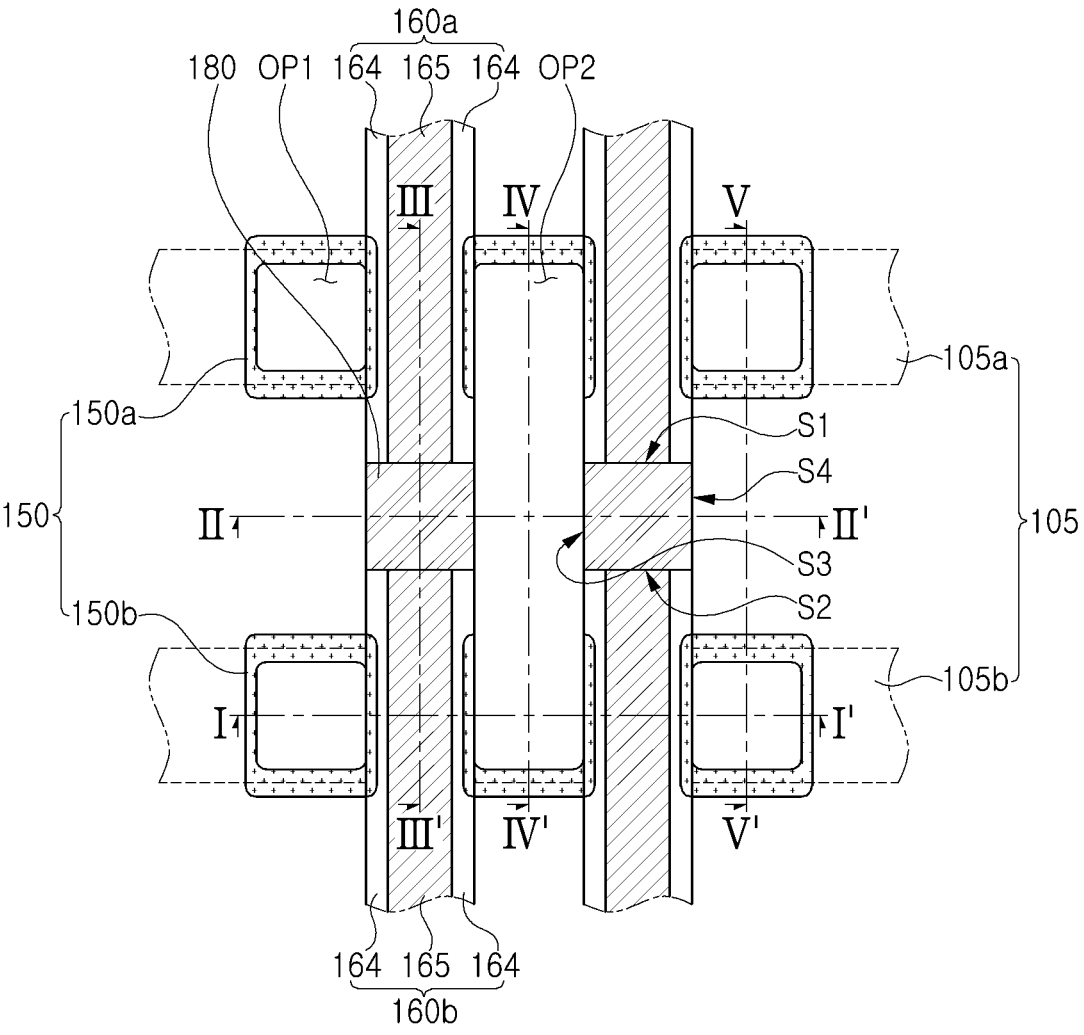

Referring to FIGS. 4A and 4B, the semiconductor device 100b may include a common contact plug 172 and a gate isolation pattern 180 configured differently from those of the semiconductor device 100 in FIGS. 1 to 2E. The common contact plug 172 may include a first lower surface in contact with the source/drain regions 150 and a second lower surface in contact with the gate isolation pattern 180, and the second lower surface may be disposed at/on a level higher than a level of the first lower surface. The second lower surface may be disposed at/on a level lower than a level of the upper surface of the lower interlayer insulating layer 1901. That is, as compared to the semiconductor device 100 in FIGS. 2A to 2E, the second lower surface may be disposed on a relatively low level. This structure may be formed by etching a portion of the upper end of the lower region 1801 of the gate isolation pattern 180 during the process of forming the second opening OP2 for forming the common contact plug 172 referring to FIG. 16. Accordingly, the level of a portion of the upper surface of the lower region 1801 in contact with the common contact plug 172 may be different from a level of a portion of the upper surface of the lower region 1801 in contact with the upper interlayer insulating layer 190u.

Figure 5A:
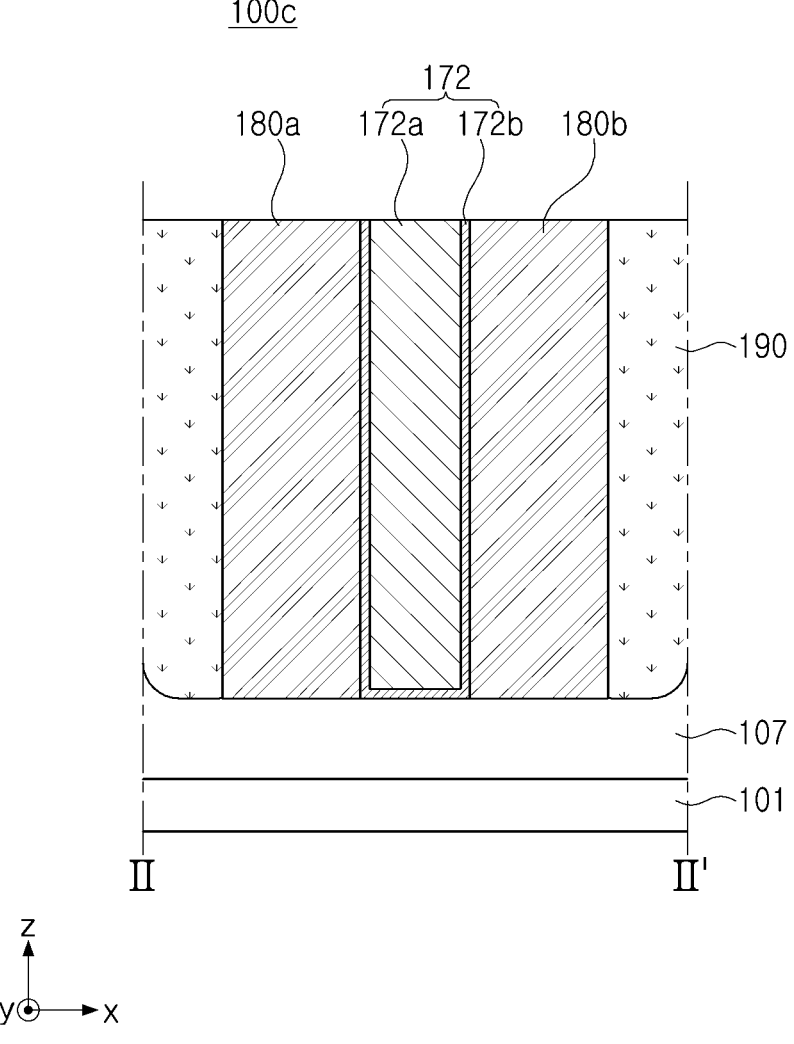
FIGS. 5A and 5B are cross-sectional diagrams illustrating a semiconductor device according to an example embodiment of the present disclosure.
Figure 5B:
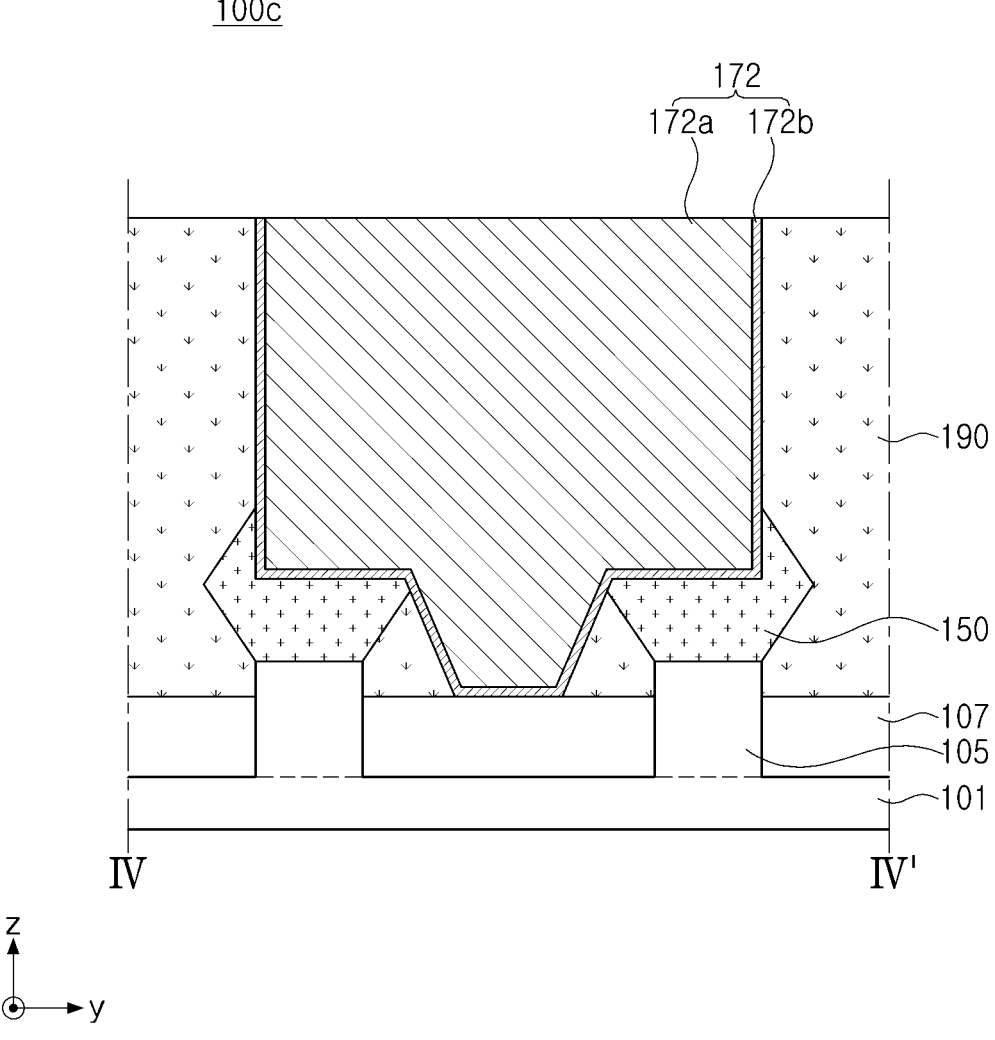
Figure 6:
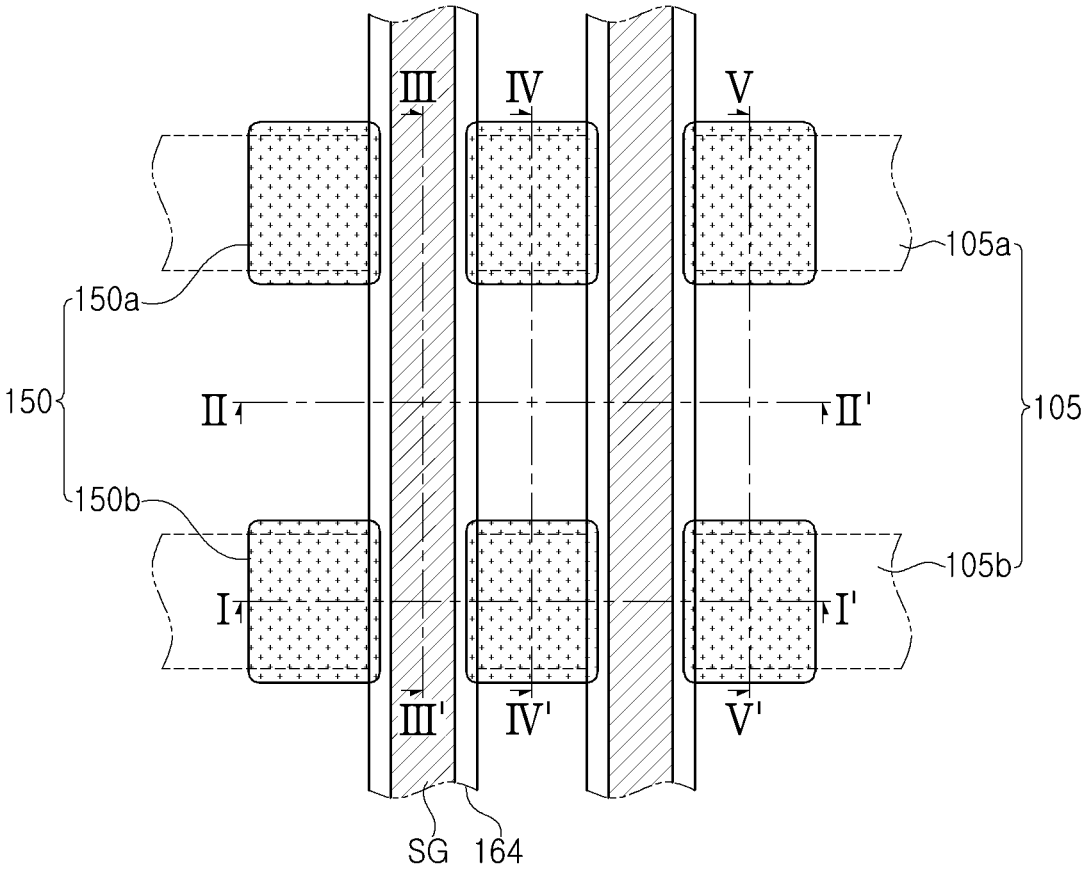
FIGS. 6, 7A-7D, 8, 9A-9C, 10A-10C, 11A-11C, 12, 13A, 13B, 14A-14C, 15A, 15B, 16, and 17A to 17D are processes of a method of manufacturing a semiconductor device in order according to an example embodiment of the present disclosure.
Figure 7A:
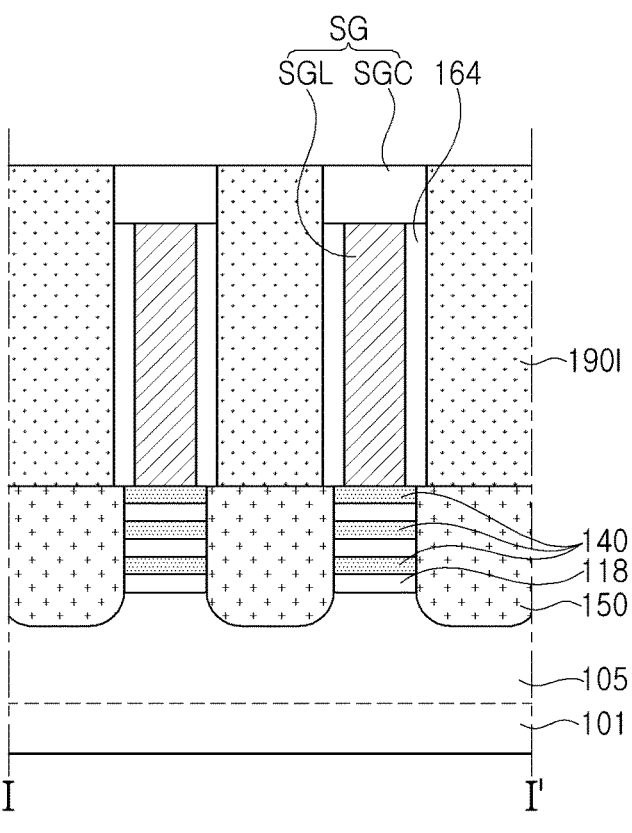
Figure 7B:
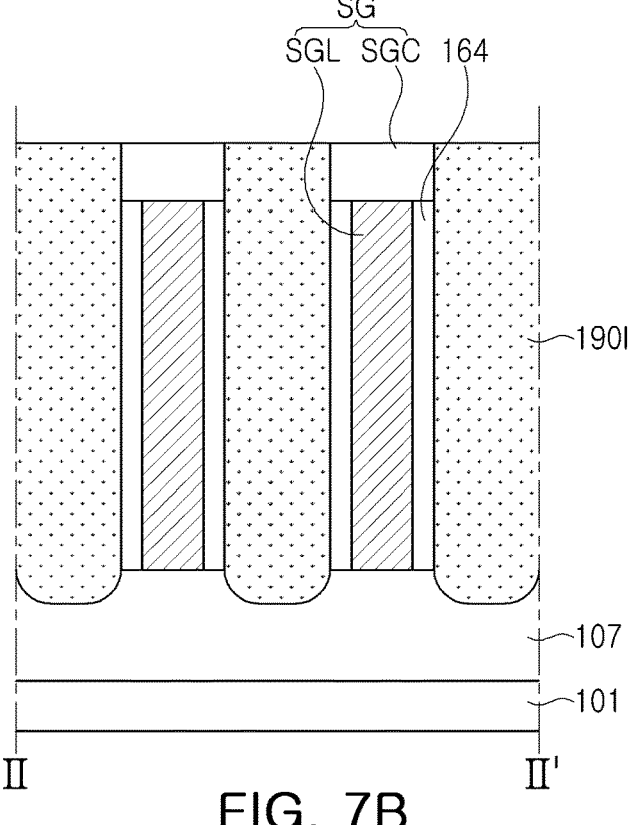
Figure 7C:
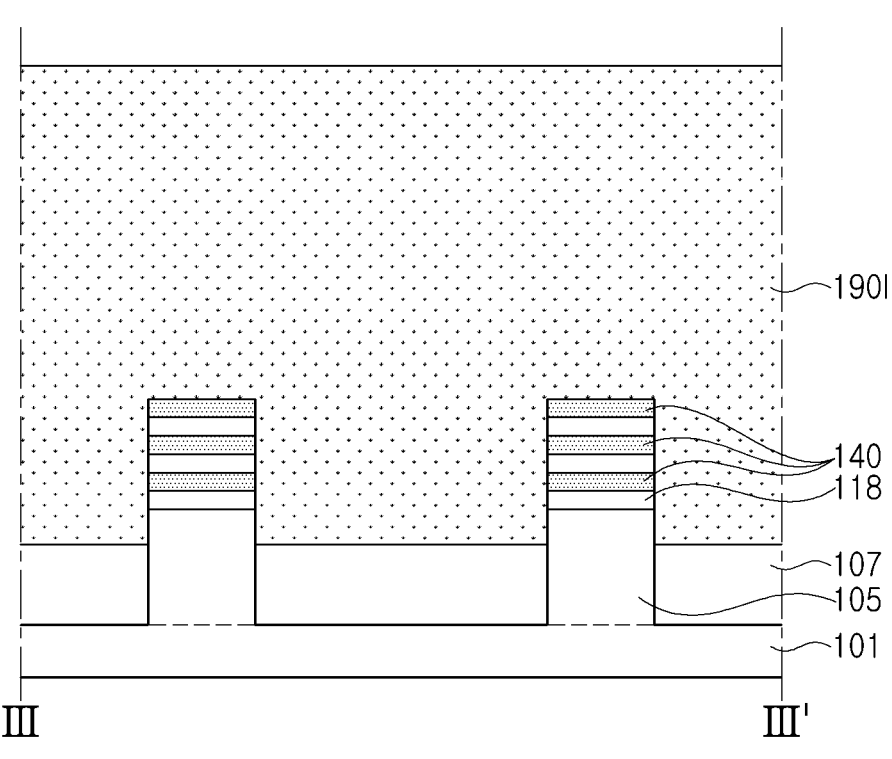
Figure 7D:
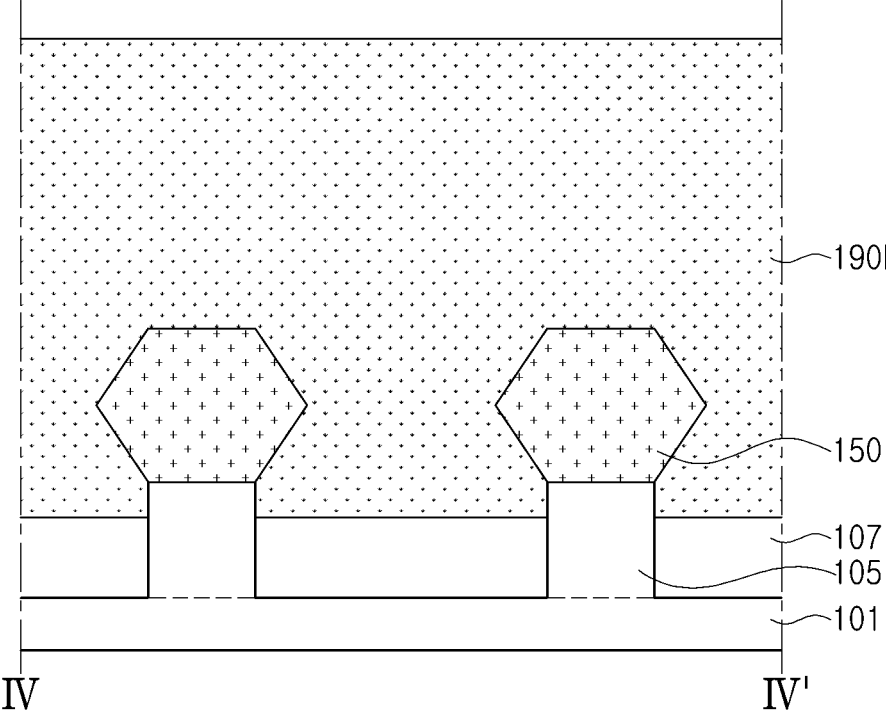
Figure 8:
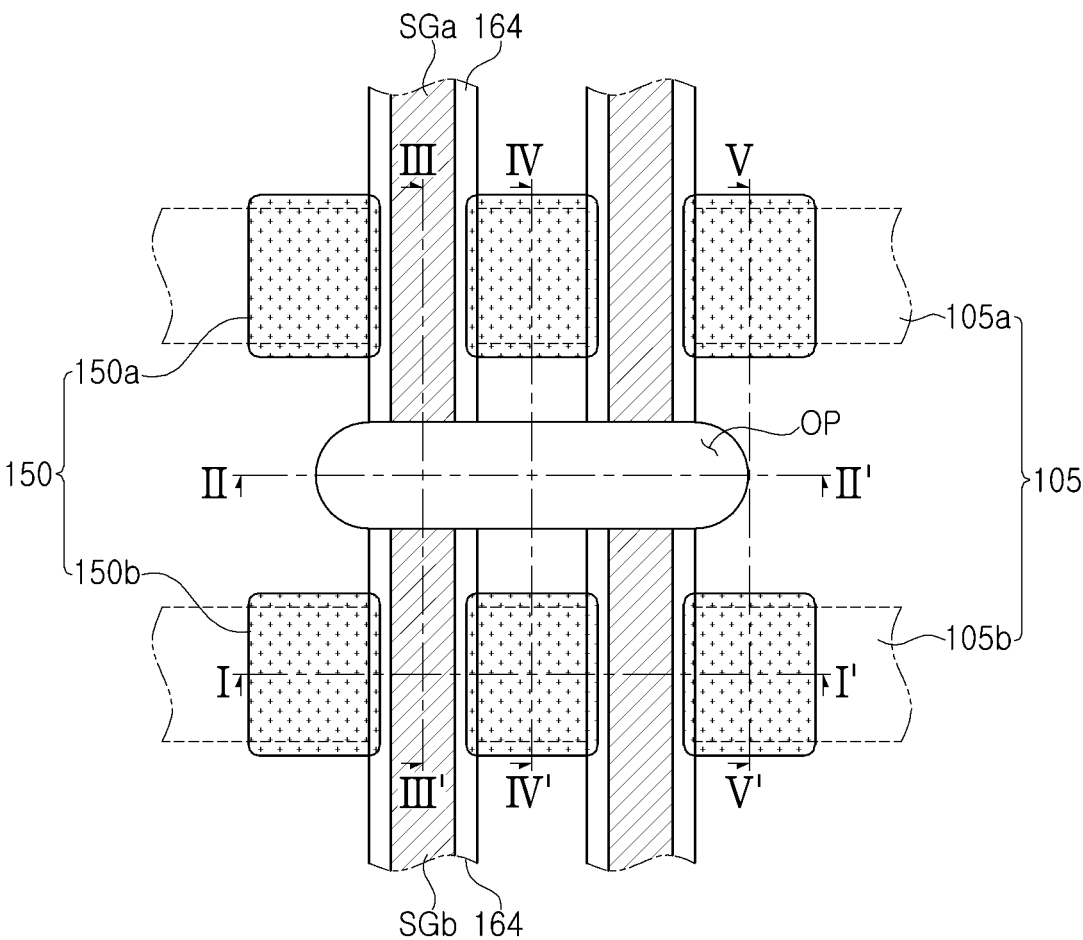
Figure 9A:
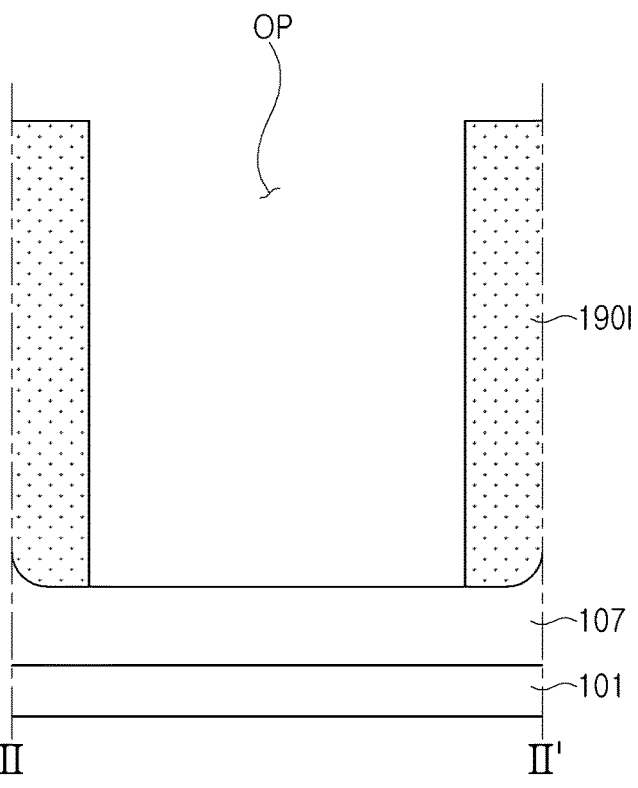
Figure 9B:
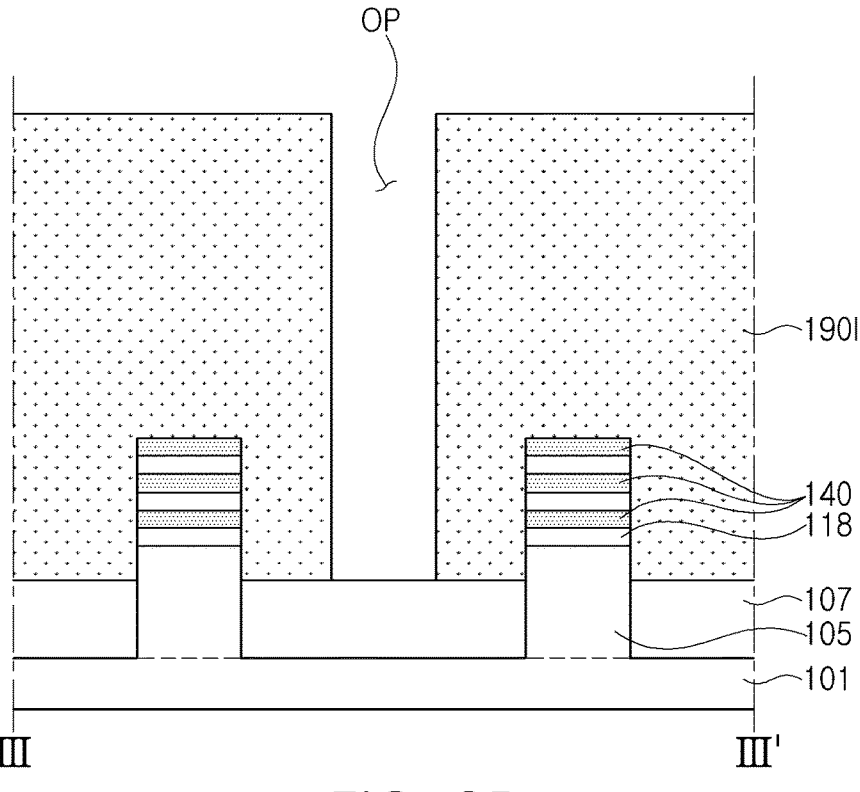
Figure 9C:
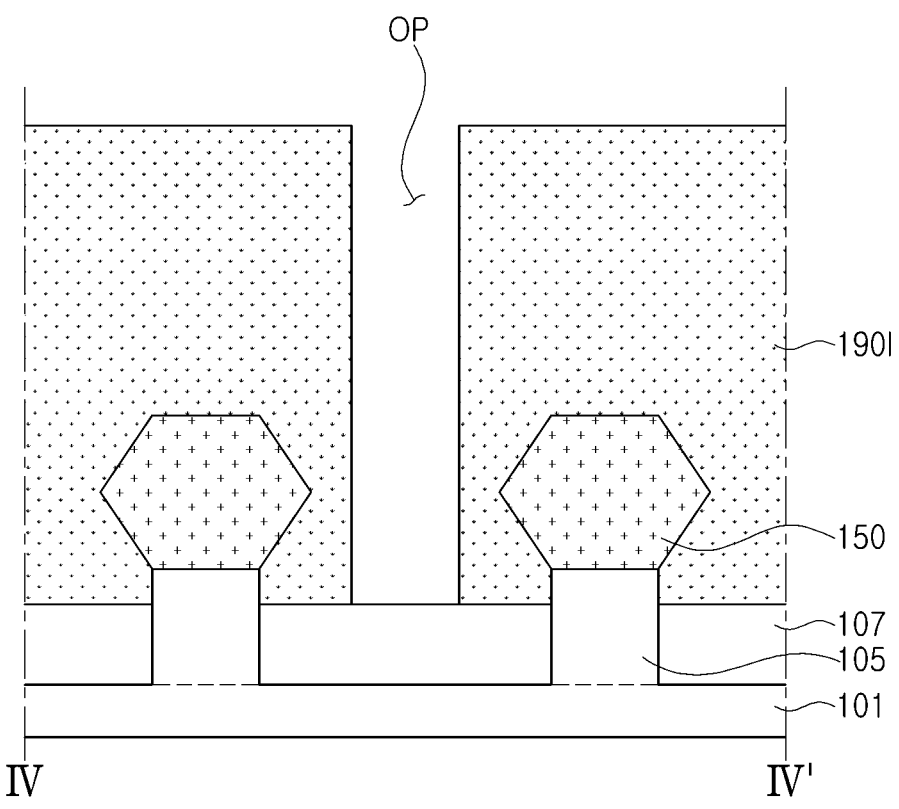
Figure 10A:
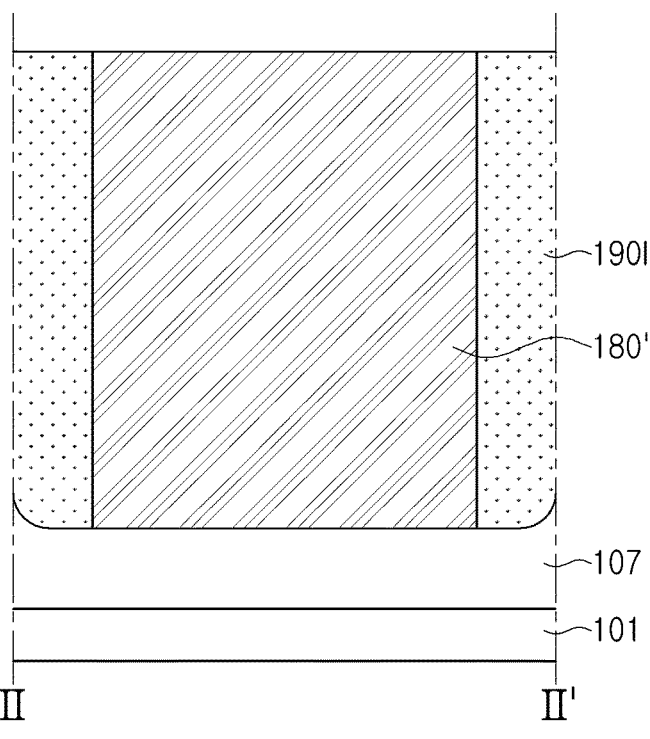
Figure 10B:
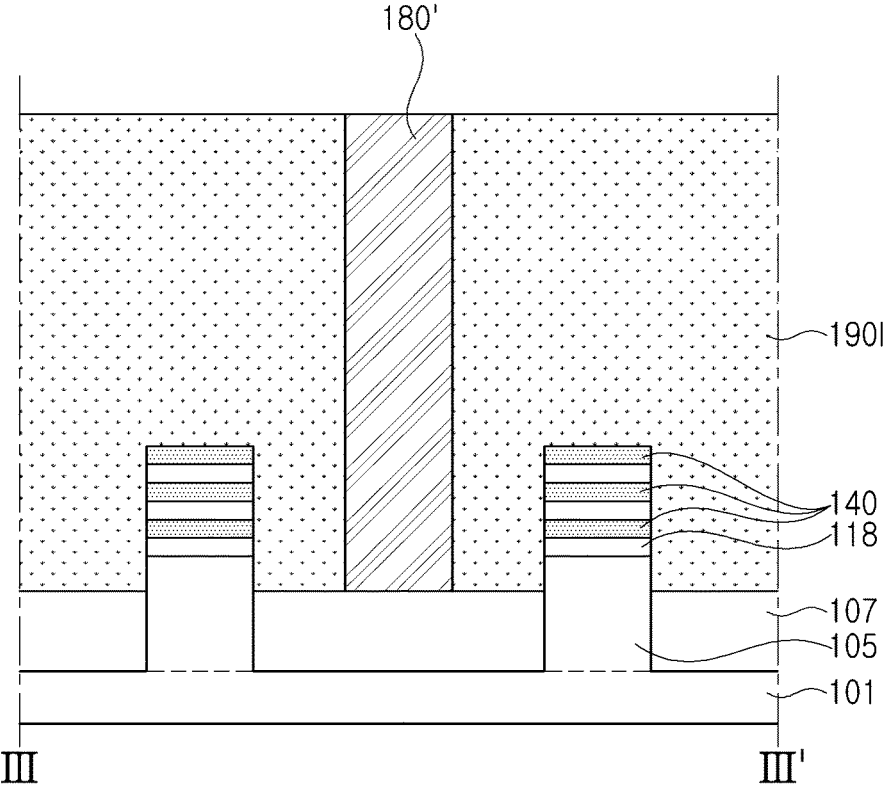
Figure 10C:
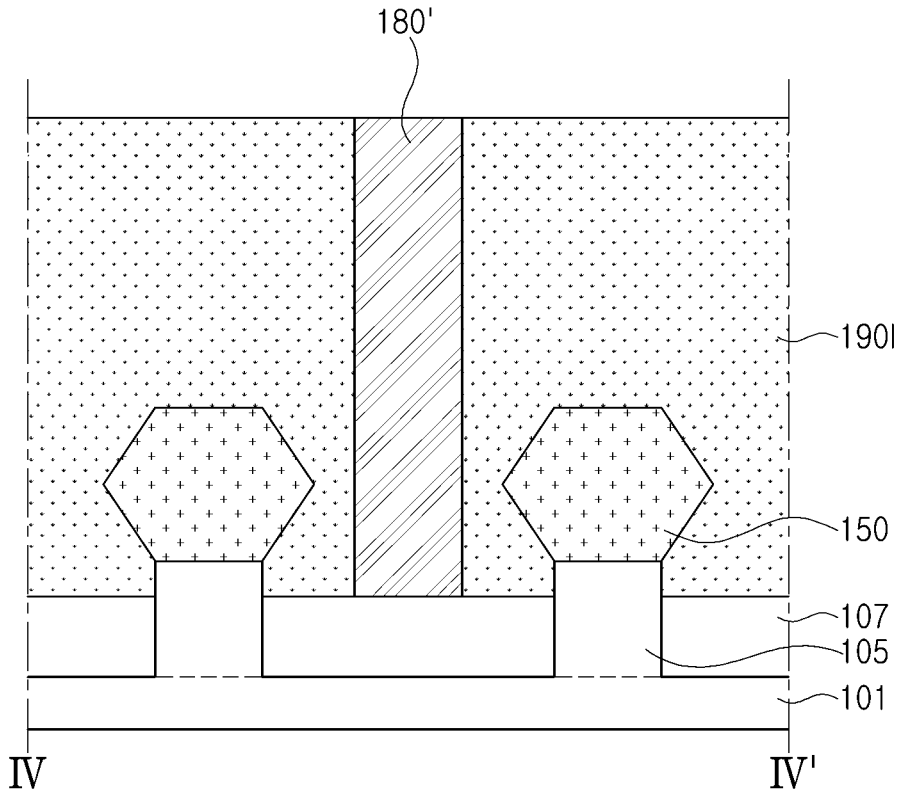

FIGS. 5A and 5B are cross-sectional diagrams illustrating a semiconductor device according to an example embodiment, taken along lines II-IF and IV-IV' in FIG. 1, respectively.

Referring to FIGS. 5A and 5B, a semiconductor device 100c according to example embodiments may include a first gate isolation pattern 180a and a second gate isolation pattern 180b isolated from each other. Differently from the semiconductor device 100 in FIGS. 1 to 2E, the gate isolation patterns 180a and 180b may have a shape in which the lower region 1801 and the upper regions 180u may completely overlap each other in the Z-direction. Also, as compared to the semiconductor device 100 in FIGS. 1 to 2E, as the lower region 1801 may have the same structure as that of the upper regions 180u, and the lower region 1801 may have a plurality of lower regions. Accordingly, the gate isolation pattern 180 may include a first gate isolation pattern 180a and a second gate isolation pattern 180b spaced apart from each other. Since the second gate isolation pattern 180b may have the same structure as that of the first gate isolation pattern 180a, the example embodiment will be described with respect to the first gate isolation pattern 180a.

The first gate isolation pattern 180a may have a lower surface disposed at/on a level lower than a level of the lower surface of the gate structures 160. The first gate isolation pattern 180a may include a first side surface S1 (see FIG. 1) in contact with the first gate structures 160a, a second side surface S2 (see FIG. 1) opposite the first side surface S1 and in contact with the second gate structures 160b, a third side surface S3 (see FIG. 1) in contact with the common contact plug 172, and a fourth side surface S4 (see FIG. 1) opposite the third side surface S3. A width of the first gate isolation pattern 180a in the X-direction may be substantially the same as widths of the first gate structure 160a and the second gate structure 160b. The third side surface S3 and the fourth side surface S4 of the first gate isolation pattern 180a may be coplanar with side surfaces of the first and second gate structures 160a and 160b.

The common contact plug 172 may include a first lower surface in contact with the first and second source/drain regions 150a and a second lower surface disposed between the first and second source/drain regions 150b. The first lower surface may be disposed at/on a level higher than a level of the second lower surface. The second lower surface may be in contact with the device isolation layers 107, but an example embodiment thereof is not limited thereto, and the second lower surface may be spaced apart from the device isolation layers 107 or may extend into the device isolation layers 107 in example embodiments. That is, differently from the semiconductor device 100 in FIGS. 1 to 2E, as the lower region 1801 of the gate isolation pattern 180 is not disposed in the region between the first and second source/drain regions 150a and 150b, the second lower surface may be disposed at/on a level lower than a level of the first lower surface through an etching process for forming the common contact plug 172.

The interlayer insulating layer 190 may be a single insulating layer not divided into upper and lower interlayer insulating layers.

FIGS. 6 to 17D are processes of a method of manufacturing a semiconductor device according to an example embodiment, illustrating an example of a method of manufacturing the semiconductor device 100 in FIG. 2E.

Figure 17A:
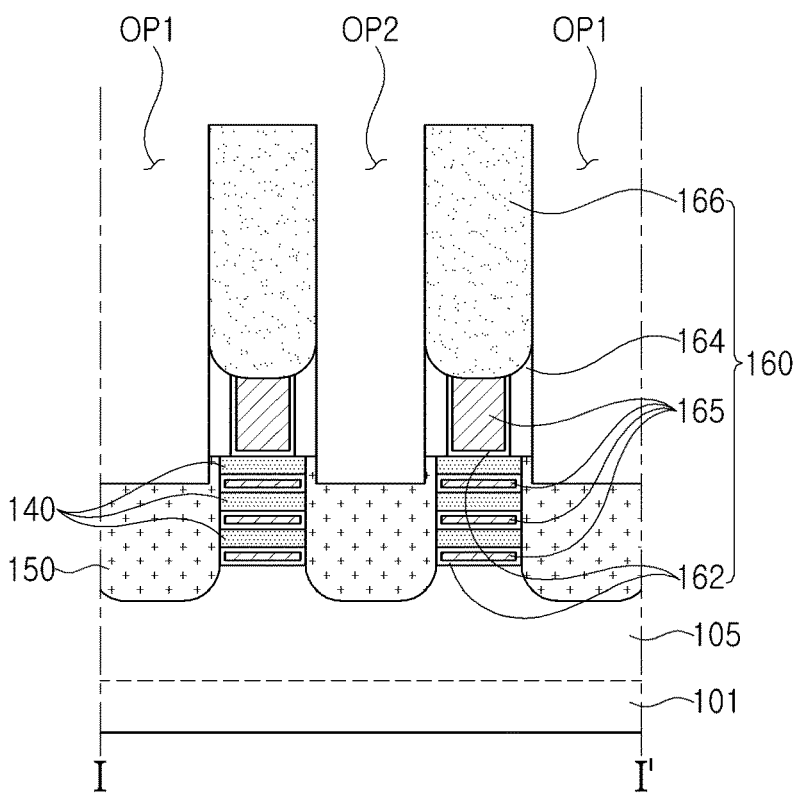
Figure 17B:
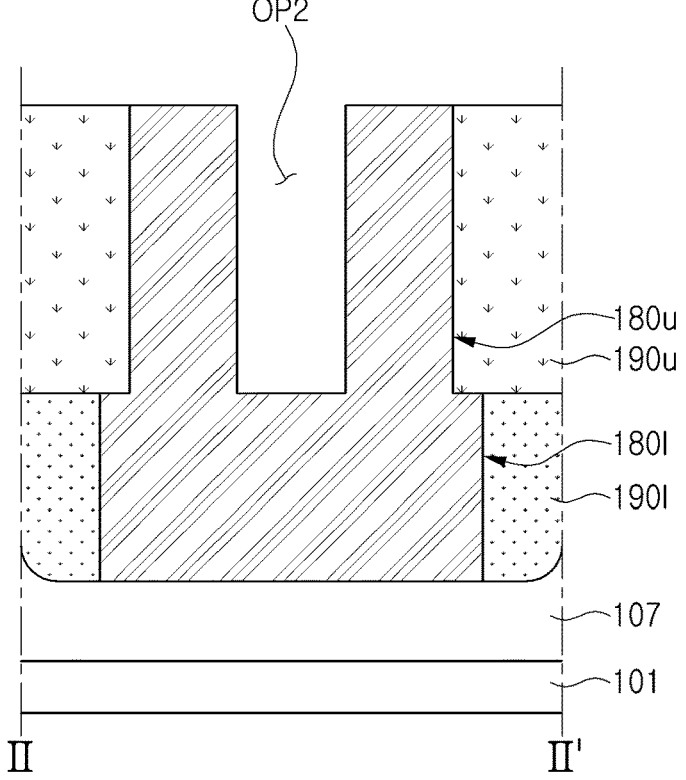
Figure 17C:
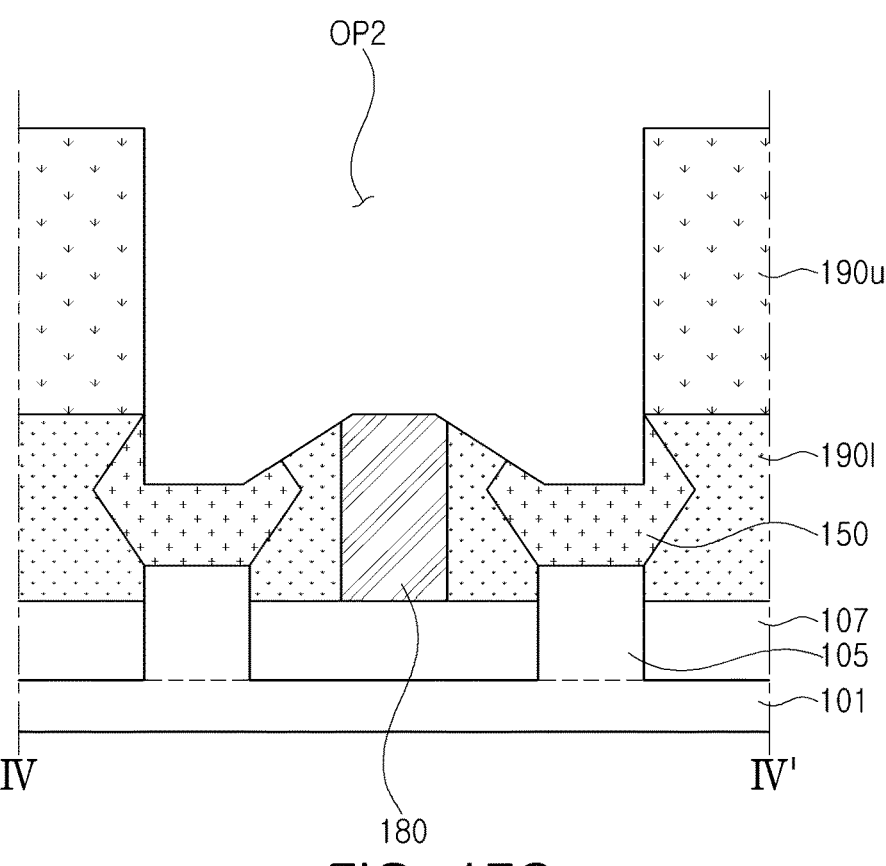
Figure 17D:
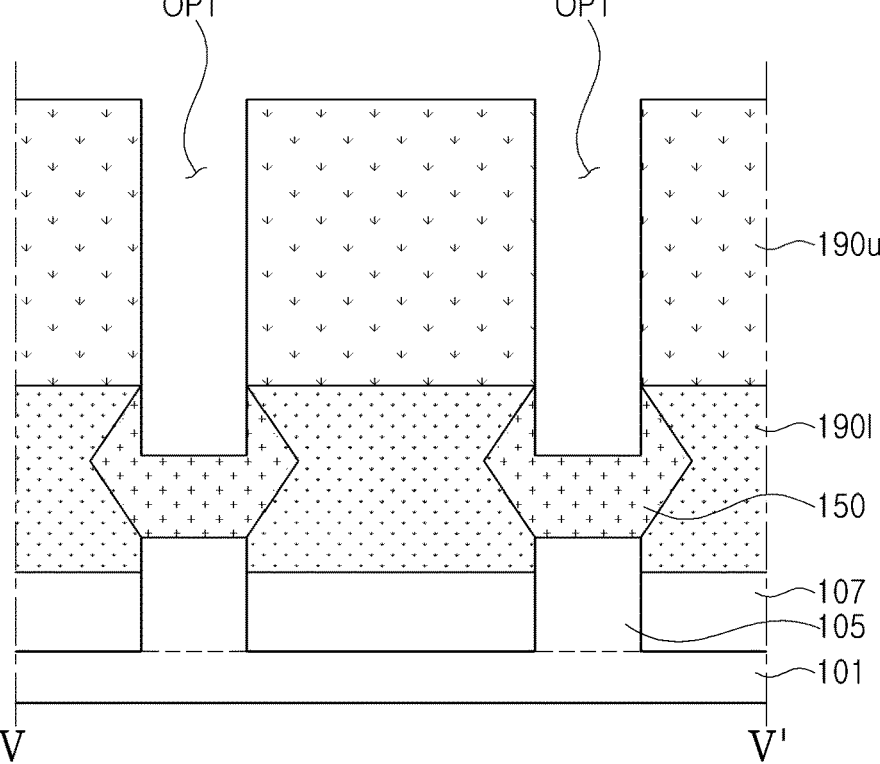

FIGS. 6, 8, 12, and 16 are plan diagrams illustrating a method of manufacturing a semiconductor device according to an example embodiment. FIGS. 7A, 11A, 14A, 15A and 17A are cross-sectional diagrams taken along line I-I' in FIGS. 6, 8, 12 and 16. FIGS. 7B, 9A, 10A, 11B, 13A, 14B, and 17B are cross-sectional diagrams taken along line II-II in FIGS. 6, 8, 12, and 16. FIGS. 7C, 9B, 10B, and 15B are cross-sectional diagrams taken along line in FIGS. 6, 8, 12, and 16. FIGS. 7D, 9C, 10C, 11C, 13B, 14C, and 17C are cross-sectional diagrams taken along line IV-IV' in FIGS. 6, 8, 12 and 16. FIG. 17D is a cross-sectional diagram taken along line V-V' in FIG. 16.

Referring to FIGS. 6, 7A, 7B, 7C, and 7D, active structures 105, 118, and 140 may be formed on a substrate 101, sacrificial gate structures SG and gate spacers 164 intersecting the active structures 105, 118, and 140 may be formed, the active regions 105 may be exposed by etching a portion of the sacrificial layers 118 and the channel layer 140 using the sacrificial gate structures SG and the gate spacers 164 as etch masks, source/drain regions 150 disposed on the exposed active regions 105 may be formed, and a lower interlayer insulating layer 1901 may be formed.

The active structures 105, 118, and 140 may be formed by forming the sacrificial layers 118 and the channel layers 140 alternately stacked on the substrate 101, and forming a trench defining the active regions 105 by etching at least a portion of the sacrificial layers 118 and the channel layers 140 alternately stacked and the substrate 101. The active structures 105, 118, and 140 may include the active regions 105 and the sacrificial layers 118 and the channel layers 140 alternately stacked on the active regions 105.

The sacrificial layers 118 and the channel layers 140 may be formed by an epitaxial growth process. The sacrificial layers 118 may be replaced by the gate dielectric layer 162 and the gate electrode 165 as illustrated in FIG. 2A through a subsequent process. The sacrificial layers 118 may be formed of a material having etch selectivity with respect to the channel layers 140. The sacrificial layers 118 and the channel layers 140 may include, for example, a semiconductor material including at least one of silicon (Si), silicon germanium (SiGe), and germanium (Ge), or may include different materials. The sacrificial layers 118 may include, for example, silicon germanium (SiGe), and the channel layers 140 may include silicon (Si). In an example embodiment, three channel layers 140 may be stacked with substantially the same thickness, but an example embodiment thereof is not limited thereto, and the number of the channel layers and the thickness of the channel layer may be varied in example embodiments.

The active regions 105 may be defined by the trench. The active regions 105 may be formed to protrude from the upper surface of the substrate 101 by removing a portion of the substrate 101. The active regions 105 may have a shape protruding upward from the substrate 101 in a direction parallel to the Z-direction, and may be formed of the same material as that of the substrate 101. The active regions 105 may be formed in a linear shape extending in one direction, such as, for example, the X-direction, and may be spaced apart from each other in the Y-direction.

In an example embodiment, the active structures 105, 118, and 140 may include a first active structure and a second active structure spaced apart from each other in the Y-direction. The first active structure may include a first active region 105a, first sacrificial layers and first channel layers alternately stacked on the first active region 105a, and the second active structure may include a second active region, and second sacrificial layers and second channel layers alternately stacked on the second active region 105b. The first active region 105a and the second active region 105b may have different types of conductivity. In an example embodiment, the first active region 105a may be N-type conductivity and the second active region 105b may be P-type conductivity.

The device isolation layers 107 may be formed by filling an insulating material in the region from which a portion of the substrate 101 is removed, and partially removing the insulating material such that the active regions 105 may protrude. The device isolation layers 107 may cover a portion of side surfaces of the active regions 105. An upper surface of the device isolation layers 107 may be disposed at/on a level lower than a level of an upper surface of the active regions 105. The device isolation layers 107 may include silicon oxide.

Thereafter, sacrificial gate structures SG crossing the active structures 105, 118, and 140 and parallel to each other may be formed. Each of the sacrificial gate structures SG may have a linear shape extending in one direction, that is, for example, a Y-direction. The sacrificial gate structures SG may be sacrificial structures formed in a region in which the gate dielectric layer 162 and the gate electrode 165 are disposed on the channel layers 140 through a subsequent process as illustrated in FIG. 2A. The sacrificial gate structures SG may include a sacrificial gate layer SGL and a sacrificial gate capping layer SGC. The sacrificial gate layer SGL may be formed of, for example, polysilicon, and the sacrificial gate capping layer SGC may be formed of a silicon nitride film. In an example embodiment, each of the sacrificial gate structures SG may further include a sacrificial gate insulating layer disposed below the sacrificial gate layer SGL. The sacrificial gate insulating layer may be formed of a material having an etch selectivity with respect to the sacrificial gate layer SGL, and may be formed of, for example, one of thermal oxide, silicon oxide, and silicon nitride.

Thereafter, the gate spacers 164 may be formed on opposite sidewalls of the sacrificial gate structures SG. The gate spacer 164 may be formed by forming a film having a uniform thickness along upper and side surfaces of the sacrificial gate structures SG and the active structures 105, 118, and 140, and performing anisotropic etching. The gate spacer 164 may include an insulating material, such as, for example, at least one of SiO, SiN, SiCN, SiOC, SiON, and SiOCN. In example embodiments, the sacrificial gate structures SG and the gate spacer 164 may be referred to as preliminary gate structures.

Thereafter, a recess may be formed by removing the exposed sacrificial layers 118 and the channel layers 140, and the active regions 105 may be exposed between the sacrificial gate structures SG. A portion of the substrate 101 may be recessed by forming the recess deeply, but an example embodiment thereof is not limited thereto, and the recess may be recessed such that a lower surface of the recess may be in contact with the substrate 101.

In this process, a portion of the side surfaces of the sacrificial layers 118 exposed by the recess may be further removed. The sacrificial layers exposed by the recess may be selectively etched with respect to the channel layers 140 by, for example, a wet etching process and may be partially removed from the side surface in the X-direction. Thereafter, internal spacer layers may be formed in a region in which a portion of the side surfaces of the sacrificial layers 118 is removed. The internal spacer layers may include at least one of SiN, SiCN, SiOCN, SiBCN, and SiBN. The internal spacer layers may be formed of the same material as that of the gate spacer 164, but an example embodiment thereof is not limited thereto. In example embodiments, the process of removing a portion of the sacrificial layers 118 and forming the internal spacer layers may be omitted.

Thereafter, the source/drain regions 150 may be formed on the active regions 105 on at least one side of the sacrificial gate structures SG and the gate spacer 164. The source/drain regions 150 may be formed by performing an epitaxial growth process within the recess. The source/drain regions 150 may include impurities by in-situ doping, for example. In an example embodiment, the source/drain regions 150 may include first source/drain regions 150a formed on the first active region 105a and a second source/drain region 150b formed on the second active region 105b.

Thereafter, the lower interlayer insulating layer 1901 may be formed by filling an insulating material to cover the sacrificial gate structures SG, the gate spacer 164, the source drain regions 150, and the device isolation layers 107 and performing a planarization process. The insulating material may be formed of oxide, nitride, oxynitride, or a low-K material. Through the planarization process, the upper surface of the lower interlayer insulating layer 1901 may be coplanar with the upper surface of the sacrificial gate structures SG.

Referring to FIGS. 8, 9A, 9B, and 9C, an opening OP penetrating through the sacrificial gate structures SG, the gate spacer 164, and the lower interlayer insulating layer 1901 may be formed.

The opening OP may have a linear shape extending in the X-direction to penetrate the plurality of sacrificial gate structures SG. The opening OP may penetrate to a depth lower than a level of the lower surface of the lowermost sacrificial layer 118. In an example embodiment, a level of the lower surface of the opening OP may be substantially the same as a level of the lower surface of the lower interlayer insulating layer 1901, but an example embodiment thereof is not limited thereto, and the lower surface of the opening OP may penetrate deeply to a level lower than a level of the lower surface of the lower interlayer insulating layer 1901. By isolating the plurality of sacrificial gate structures SG by the opening OP, first sacrificial gate structures SGa and second sacrificial gate structures SGb opposite each other in the Y-direction and physically/electrically isolated from each other may be formed.

Referring to FIGS. 8, 10A, 10B, and 10C, a preliminary gate isolation pattern 180' may be formed in the opening OP.

The preliminary gate isolation pattern 180' may be formed by filling an insulating material in the opening OP and performing a planarization process such that the upper surface of the lower interlayer insulating layer 1901 may be exposed. The preliminary gate isolation pattern 180' may include a silicon nitride material or a nitride material.

Figure 11A:
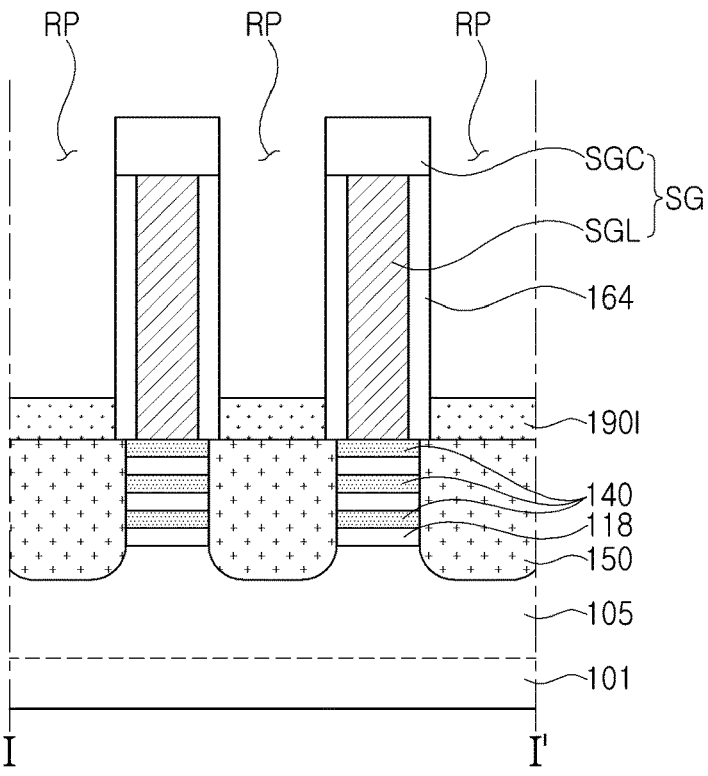
Figure 11B:
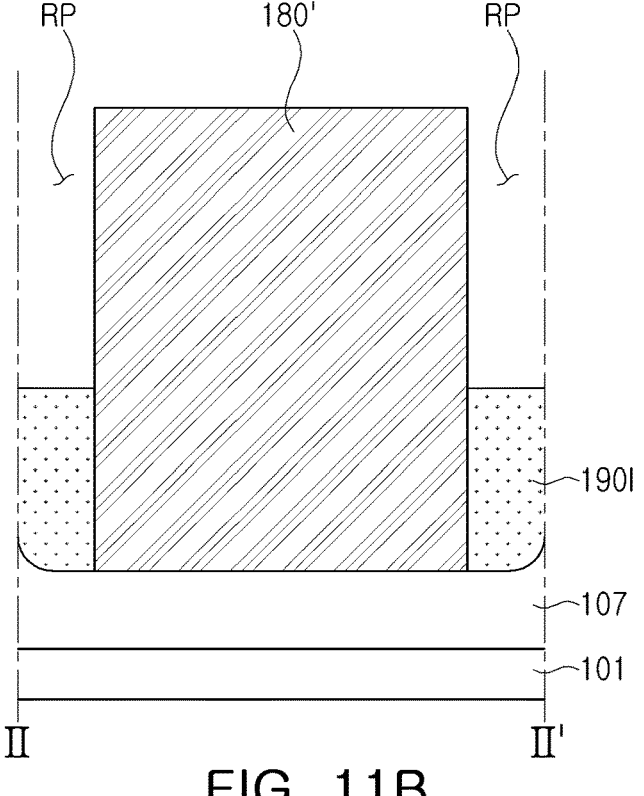
Figure 11C:
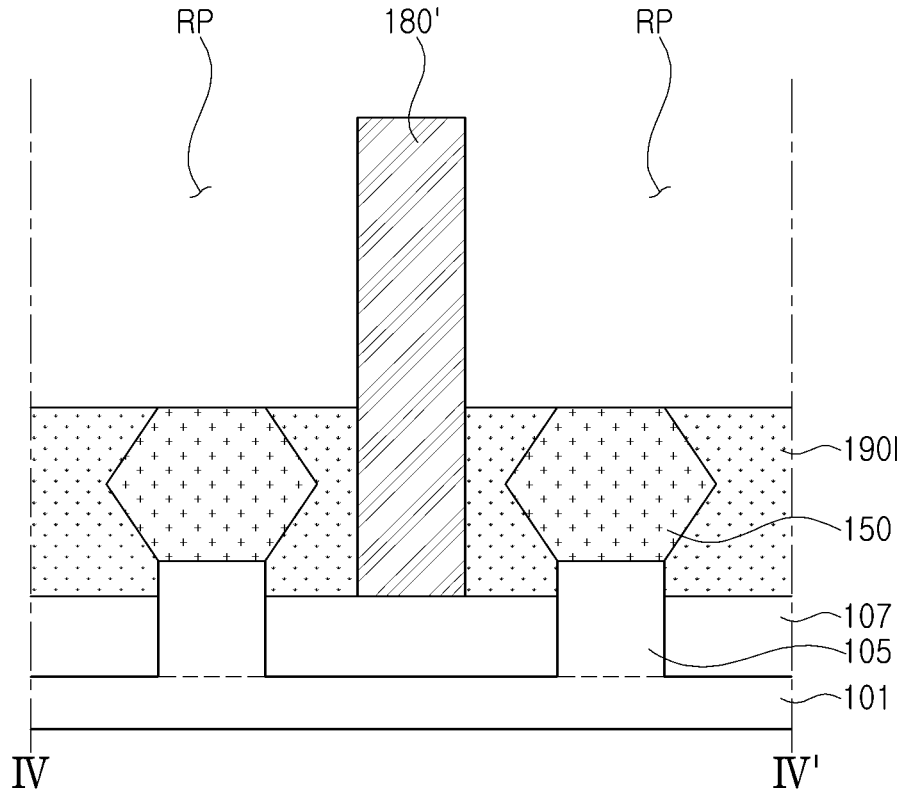

Referring to FIGS. 11A, 11B, and 11C, a recess region RP may be formed by recessing a portion of an upper end of the lower interlayer insulating layer 1901.

The recess region RP may be formed by selectively etching the lower interlayer insulating layer 1901 with respect to the sacrificial gate structures SG, the gate spacer 164, and the preliminary gate isolation pattern 180'. The selective etching process may be performed by etching the lower interlayer insulating layer 1901 using the sacrificial gate structures SG, the gate spacers 164, and the preliminary gate isolation pattern 180' as etch masks. The depth of the recess region RP may be varied to various depths to adjust a thickness of the lower region 1801 (see FIG. 13A) of the gate isolation pattern 180 (see FIG. 13A) through a subsequent process. As the recess region RP is formed, a portion of the side surface of the preliminary gate isolation pattern 180' may be exposed.

In this process, when the recess region RP is formed deeply to a level lower than a level of the lower surface of the preliminary gate isolation pattern 180', the semiconductor device 100c in FIGS. 5A and 5B may be formed through a subsequent process described later.

Figure 12:
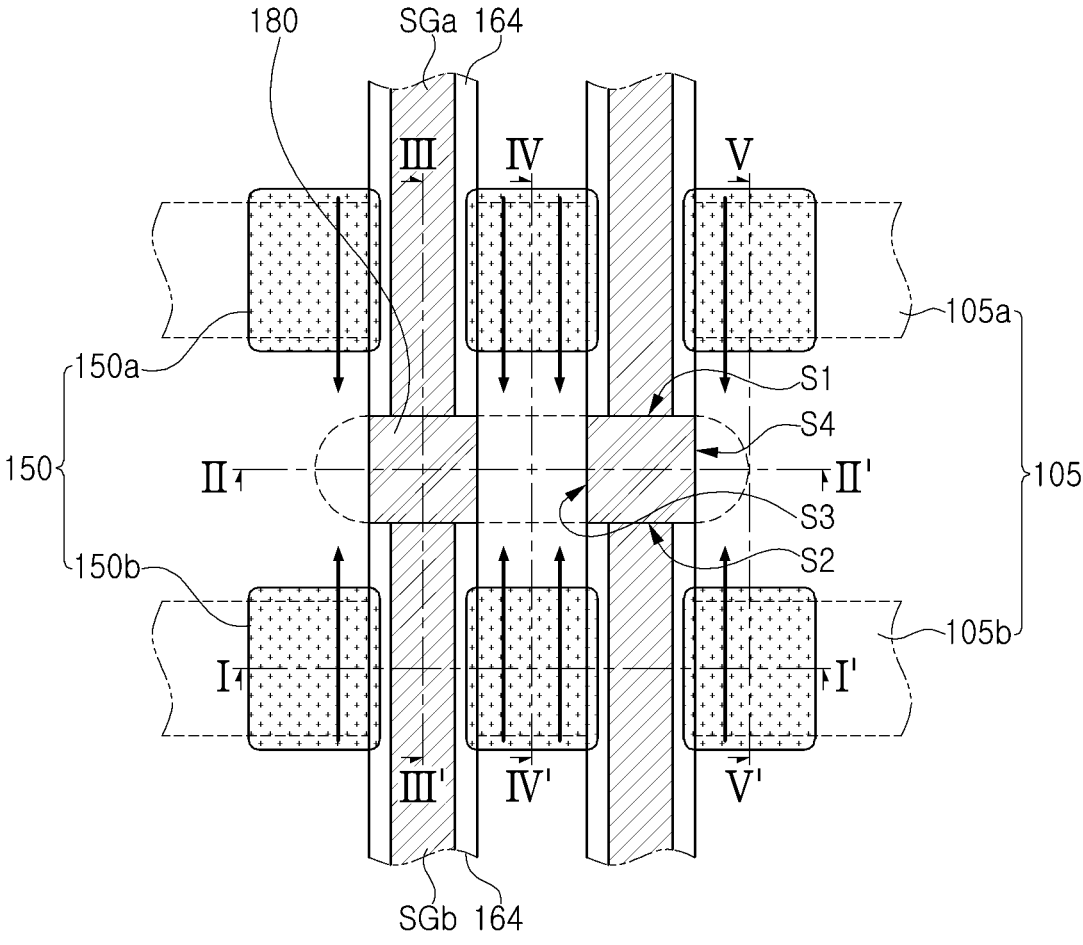
Figure 13A:
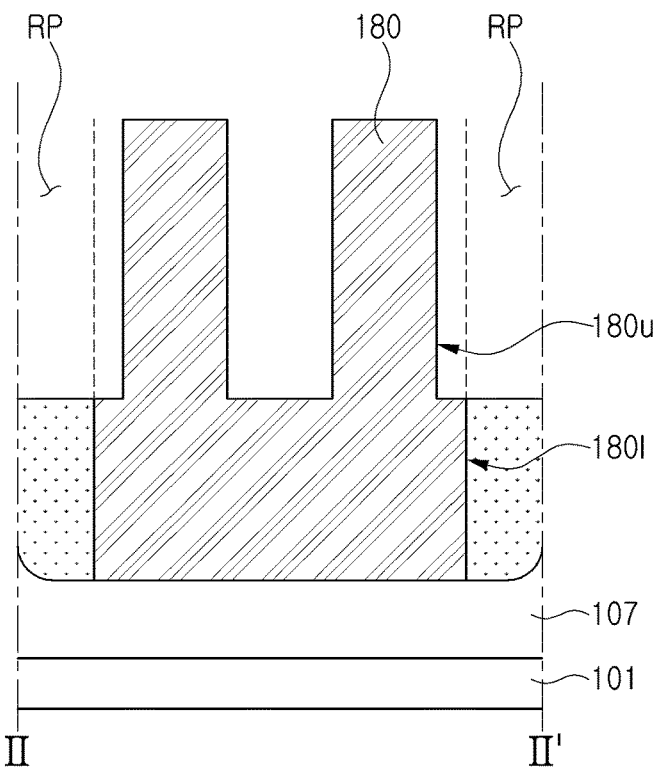
Figure 13B:
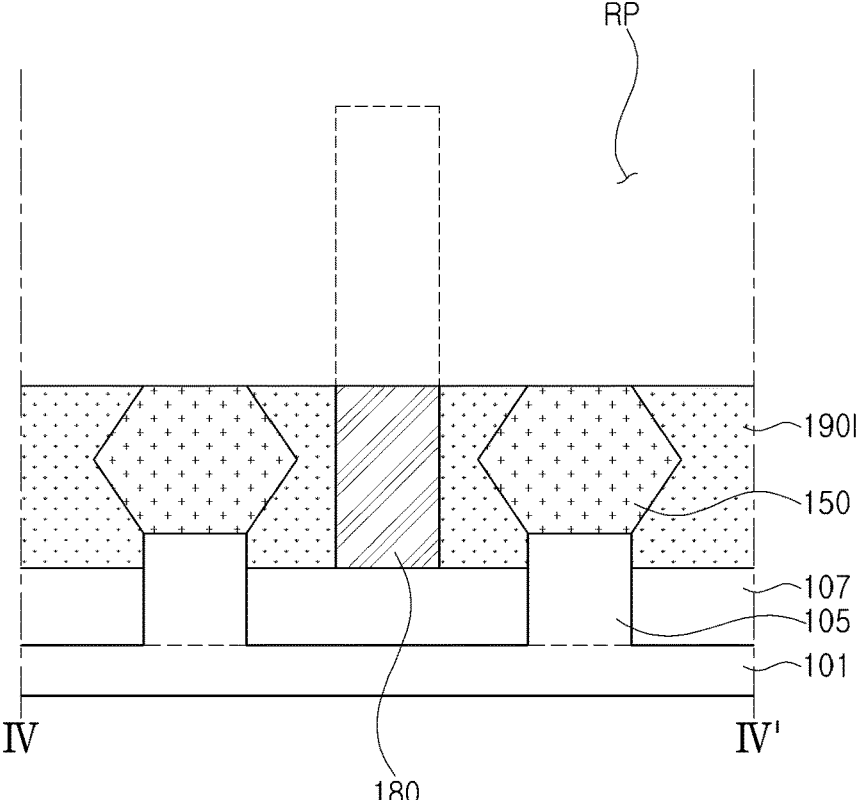

Referring to FIGS. 12, 13A, and 13B, the gate isolation pattern 180 may be formed by etching portions of the preliminary gate isolation pattern 180'.

As the recess region RP is formed, a side surface of the preliminary gate isolation pattern 180' disposed adjacent/on the lower surface of the recess region RP, other than the first side surface S1 in contact with the first sacrificial gate structures SGa and the gate spacer 164 disposed on the sidewall of the first sacrificial gate structures SGa and the second side surface S2 in contact with the second sacrificial gate structures SGb and the gate spacer 164 disposed on the sidewall of the second sacrificial gate structures SGb, may be exposed. The exposed side surface may be removed by performing an etching process using an ion beam or a neutron beam, and the gate isolation pattern 180 including the lower region 1801 and the upper region 180u may be formed. The etching process may be performed by allowing the ion beam or the neutron beam to be incident in parallel to the y-axis in which the sacrificial gate structures SG extend, or to be incident by being tilted at a predetermined angle from the y-axis to the z-axis. The predetermined angle may be in the range of 0 degrees (parallel to the y-axis) to 90 degrees (parallel to the z-axis), but as the predetermined angle is close to 0 degrees, the etch rate may increase such that the exposed side surface of the preliminary gate isolation pattern 180' may be removed efficiently.

Portions of the preliminary gate isolation pattern 180' that are spaced apart from each other by removing the exposed side surface may correspond to the upper regions 180u of the gate isolation pattern 180, and a further portion of the preliminary gate isolation pattern 180' disposed below the recess region RP and not etched may correspond to the lower region 1801 of the gate isolation pattern 180. A lower surface of the recess region RP or an upper surface of the etched lower interlayer insulating layer 1901 may be disposed at/on substantially the same level as a level of an upper surface of the lower region 1801. Each of the upper regions 180u may include the third side surface S3 formed through the etching process along with the first side surface S1 and the second side surface S2, and the fourth side surface S4 opposite the third side surface S3. The third side surface S3 and the fourth side surface S4 may be coplanar with an outer side wall of the gate spacer 164 as the etching process is performed by directing an ion beam to be parallel to the y-axis or to be tilted at a predetermined angle therefrom.

Figure 14A:
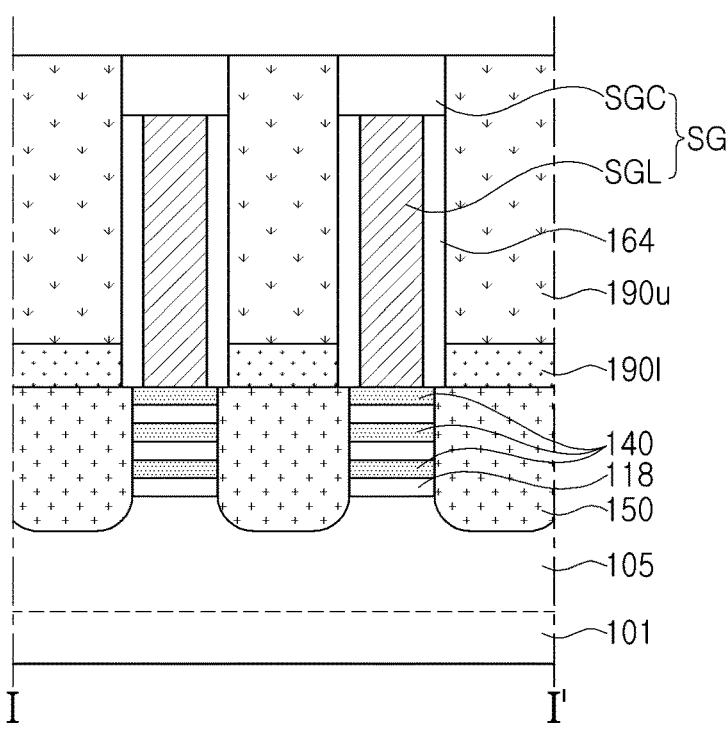
Figure 14B:
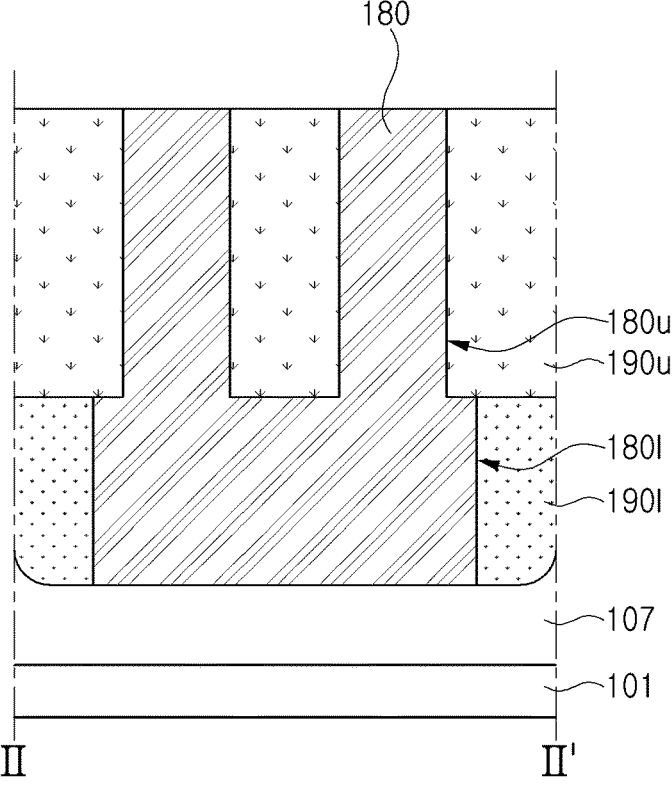
Figure 14C:
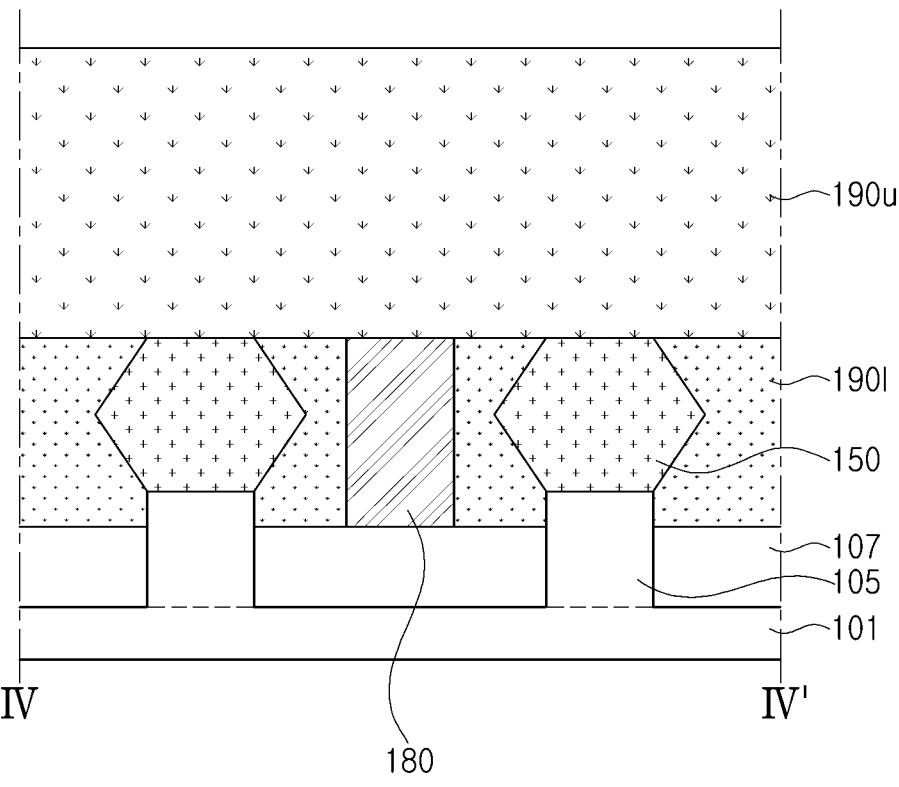

Referring to FIGS. 14A, 14B, and 14C, an upper interlayer insulating layer 190u may be formed.

The upper interlayer insulating layer 190u may be formed by covering the lower interlayer insulating layer 1801, the sacrificial gate structures SG, and the gate isolation pattern 180 with an insulating material and performing a planarization process. The upper interlayer insulating layer 190u may include the same material as that of the lower interlayer insulating layer 1901, but an example embodiment thereof is not limited thereto.

In an example embodiment, an impurity region may be formed on the upper end of the lower interlayer insulating layer 1901 according to the etching process using an ion beam or a neutron beam. Accordingly, in this process, a cleaning process may be further performed before the upper interlayer insulating layer 190u is formed.

Figure 15A:
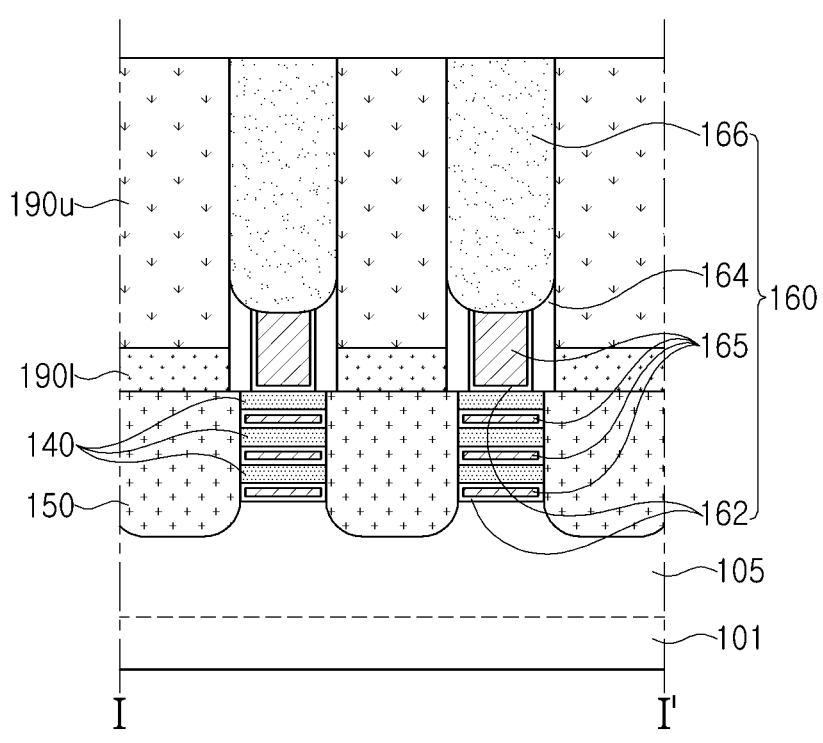
Figure 15B:
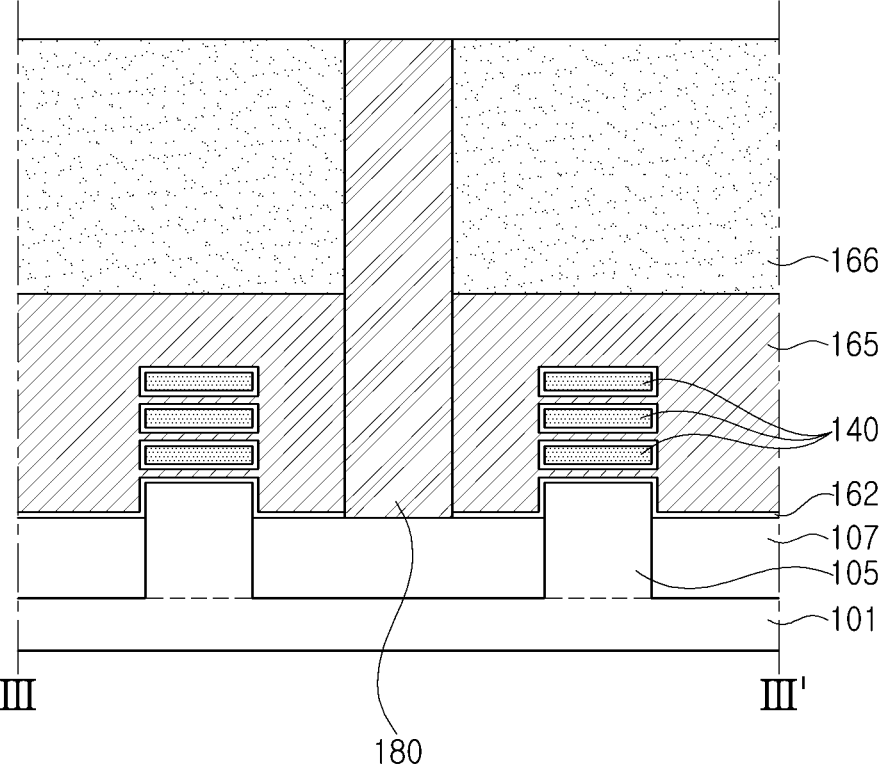

Referring to FIGS. 15A and 15B, the sacrificial gate structures SG may be recessed to form the gate electrodes 165. Moreover, gate dielectric layers 162 may be formed on sidewalls of the gate electrodes 165, and gate capping layers 166 may be formed on top of the gate electrodes 165 and the gate spacers 164.

Referring to FIGS. 16, 17A, 17B, 17C, and 17D, openings OP1 and OP2 penetrating through the interlayer insulating layers 1901 and 190u on the active regions 105 may be formed.

The openings OP1 and OP2 may penetrate the interlayer insulating layers 1901 and 190u, may extend into the source/drain regions 150 and may be in contact with the source/drain regions 150. In an example embodiment, the openings OP1 and OP2 may have inclined side surfaces of which widths may decrease in the direction toward the substrate 101 depending on an aspect ratio, but an example embodiment thereof is not limited thereto.

Each of the first openings OP1 may have a hole shape connected to one of the first source/drain regions 150a and the second source/drain regions 150b.

The second opening OP2 may penetrate the interlayer insulating layers 1901 and 190u and may simultaneously be in contact with the first and second source/drain regions 150a and 150b. The second opening OP2 may have a linear shape extending in a Y-direction. The second opening OP2 may include regions in which depths of openings are different as etch resistance of the gate isolation pattern 180 is higher than that of the lower interlayer insulating layer 1901 and the source/drain regions 150. That is, the second opening OP2 may have a first lower surface in contact with the source/drain regions 150 and a second lower surface in contact with the gate isolation pattern 180 and disposed at/on a level higher than a level of the first lower surface.

Thereafter, referring to FIGS. 1 to 2E, a single contact plug 171 and a common contact plug 172 may be formed by filling a conductive material in the openings OP1 and OP2 and performing a planarization process.

In this process, the plug layers 171a and 172a may be formed by conformally forming barrier layers 171b and 172b covering side surfaces and bottom surfaces of the openings OP1 and OP2, filling a conductive material in the openings OP1 and OP2, and performing a planarization process to expose the upper surface of the upper interlayer insulating layer 190u. Accordingly, the single contact plug 171 filling the first openings OP1 and the common contact plug 172 filling the second openings OP2 may be formed.

According to the aforementioned example embodiments, by forming a common contact plug after removing an insulating material remaining in the process of forming a gate isolation pattern isolating the plurality of gate structures from each other, a semiconductor device having improved production yield may be provided. Also, the insulating material may be effectively removed without damage to the gate structure using a tilted ion beam.

While the example embodiments have been illustrated and described above, it will be apparent to those skilled in the art that modifications and variations could be made without departing from the scope of the present disclosure as defined by the appended claims.

What is claimed is:

1. A semiconductor device comprising:
active regions including a first active region and a second active region parallel to each other on a substrate and extending in a first direction;
a plurality of gate structures including first gate structures intersecting the first active region, extending in a second direction perpendicular to the first direction, and parallel to each other, and second gate structures intersecting the second active region, extending in the second direction, and opposite the first gate structures in the second direction, on the substrate;
a gate isolation pattern between the first gate structures and the second gate structures;
a source/drain region on at least one side of the plurality of gate structures and including a first source/drain region on the first active region and a second source/drain region on the second active region; and
a common contact plug electrically connected to the first and second source/drain regions,
wherein the gate isolation pattern includes:
a lower region; and
upper regions extending from the lower region in a third direction and spaced apart from each other in the first direction,
wherein the upper regions are between the first gate structures and the second gate structures, wherein a portion of the common contact plug is between the upper regions in the first direction,
wherein each of the upper regions includes a third side surface in contact with the common contact plug and a fourth side surface opposite the third side surface,
wherein the third side surface is coplanar with side surfaces of the first and second gate structures,
wherein the first and second directions are parallel to an upper surface of the substrate, and
wherein the third direction is perpendicular to the upper surface of the substrate.

2. The semiconductor device of claim 1, wherein each of the upper regions of the gate isolation pattern further includes a first side surface in contact with the first gate structures and a second side surface opposite the first side surface and in contact with the second gate structures.

3. The semiconductor device of claim 2, wherein a width of the first side surface is substantially equal to a width of each of the first gate structures in the first direction and a width of the second side surface is substantially equal to a width of each of the second gate structures in the first direction.

4. The semiconductor device of claim 1, wherein widths of the lower region and the upper regions of the gate isolation pattern are substantially equal in the second direction.

5. The semiconductor device of claim 1,
wherein the upper regions of the gate isolation pattern overlap respective portions of the lower region of the gate isolation pattern in the third direction, and
wherein an upper surface of the common contact plug is coplanar with respective upper surfaces of the upper regions of the gate isolation pattern.

6. The semiconductor device of claim 1, wherein the lower region and the upper regions of the gate isolation pattern provide a step difference along the first direction.

7. The semiconductor device of claim 1, wherein the gate isolation pattern includes at least one of a silicon nitride material, a silicon oxynitride material, a silicon oxide material, or a nitride material.

8. The semiconductor device of claim 1, wherein the common contact plug includes a lower surface comprising a first portion in contact with the first and second source/drain regions and a second portion in contact with the lower region of the gate isolation pattern.

9. The semiconductor device of claim 8, wherein the first portion of the lower surface is at a level lower than a level of the second portion of the lower surface.

10. The semiconductor device of claim 1, wherein the common contact plug is on a side surface of the lower region of the gate isolation pattern.

11. The semiconductor device of claim 1, further comprising:
a lower interlayer insulating layer on the active regions; and
an upper interlayer insulating layer on the lower interlayer insulating layer,
wherein an upper surface of the lower interlayer insulating layer is substantially coplanar with an upper surface of the lower region of the gate isolation pattern.

12. The semiconductor device of claim 11,
wherein an upper end of the lower interlayer insulating layer includes impurities, and
wherein a lower surface of the upper interlayer insulating layer is in contact with the upper surface of the lower interlayer insulating layer.

13. A semiconductor device comprising:

a first active region and a second active region parallel to each other on a substrate and extending in a first direction;

a device isolation layer between the first active region and the second active region;

a plurality of gate structures including first gate structures intersecting the first active region, extending in a second direction perpendicular to the first direction, and parallel to each other, and second gate structures intersecting the second active region, extending in the second direction, and opposite the first gate structures in the second direction, on the substrate;

a gate isolation pattern on the device isolation layer and including a lower region and upper regions spaced apart from each other in the first direction on the lower region; and a first source/drain region on the first active region and a second source/drain region on the second active region, wherein each of the upper regions of the gate isolation pattern includes a first side surface in contact with the first gate structures, a second side surface opposite the first side surface and in contact with the second gate structures, a third side surface, and a fourth side surface opposite the third side surface, and wherein a width of the lower region of the gate isolation pattern in the second direction is substantially equal to a width of each of the upper regions, and the lower region includes first portions overlapped by the upper regions and a second portion extending from the overlapped first portions in the first direction.

14. The semiconductor device of claim 13, further comprising:

a common contact plug electrically connected to the first and second source/drain regions, wherein the common contact plug includes a lower surface comprising a first portion in contact with the first and second source/drain regions and a second portion in contact with the lower region of the gate isolation pattern.

15. The semiconductor device of claim 13, further comprising:

a lower interlayer insulating layer on the first active region and the second active region; and an upper interlayer insulating layer on the lower interlayer insulating layer, wherein the upper interlayer insulating layer is on an upper surface of the lower region of the gate isolation pattern and a side surface of each of the upper regions of the gate isolation pattern.

16. The semiconductor device of claim 13, further comprising:

first channel layers stacked and spaced apart from each other in a third direction perpendicular to an upper surface of the substrate on the first active region; and second channel layers stacked and spaced apart from each other in the third direction on the second active region, wherein each of the plurality of gate structures includes a gate electrode, a gate spacer on opposite sides of the gate electrode, and a capping layer on the gate electrode and the gate spacer, and wherein the gate electrode surrounds the first and second channel layers.

17. A semiconductor device comprising:

active regions including a first active region and a second active region parallel to each other on a substrate and extending in a first direction;

a plurality of channel layers including a plurality of first channel layers spaced apart from each other in a third direction perpendicular to an upper surface of the substrate on the first active region and a plurality of second channel layers spaced apart from each other in the third direction on the second active region;

a device isolation layer between the first active region and the second active region;

a plurality of gate structures including first gate structures intersecting the first active region, extending in a second direction perpendicular to the first direction, and parallel to each other, and second gate structures intersecting the second active region, extending parallel to each other in the second direction, and opposite the first gate structures in the second direction, on the substrate;

a gate isolation pattern electrically isolating the first and second gate structures from each other on the device isolation layer;

source/drain regions including a first source/drain region on the first active region and a second source/drain region on the second active region; and a common contact plug electrically connected to the first and second source/drain regions, wherein a side surface of the common contact plug extends along the first and second gate structures and the gate isolation pattern, wherein a lower surface of the common contact plug comprises a first portion in contact with the source/drain regions and a second portion in contact with the gate isolation pattern and at a level higher than a level of the first portion, and wherein a lower surface of the gate isolation pattern is at a level lower than a level of a lower surface of a lowermost channel layer among the plurality of channel layers.

18. The semiconductor device of claim 17, wherein the lower surface of the gate isolation pattern is at a level lower than a level of lower surfaces of the source/drain regions.

19. The semiconductor device of claim 17, wherein the gate isolation pattern includes a lower region and upper regions extending from the lower region in the third direction and spaced apart from each other in the first direction, wherein the upper regions are between the first gate structures and the second gate structures, wherein the second portion of the lower surface of the common contact plug is in contact with an upper surface of the lower region, and wherein the second portion of the common contact plug is between the upper regions on the second portion of the lower surface.

* * * * *